(12) United States Patent
Ye et al.

(10) Patent No.: US 8,930,172 B2
(45) Date of Patent: Jan. 6, 2015

(54) METHODS AND SYSTEMS FOR PARAMETER-SENSITIVE AND ORTHOGONAL GAUGE DESIGN FOR LITHOGRAPHY CALIBRATION

(75) Inventors: Jun Ye, Palo Alto, CA (US); Yu Cao, Saratoga, CA (US); Hanying Feng, Fremont, CA (US); Wenjin Shao, Sunnyvale, CA (US)

(73) Assignee: ASML Netherlands B.V., Veldhoven (NL)

( * ) Notice: Subject to any disclaimer, the term of this patent is extended or adjusted under 35 U.S.C. 154(b) by 694 days.

(21) Appl. No.: 13/128,630

(22) PCT Filed: Nov. 10, 2009

(86) PCT No.: PCT/US2009/063798
§ 371 (c)(1),
(2), (4) Date: May 10, 2011

(87) PCT Pub. No.: WO2010/054350
PCT Pub. Date: May 14, 2010

(65) Prior Publication Data
US 2011/0224956 A1    Sep. 15, 2011

Related U.S. Application Data

(60) Provisional application No. 61/113,004, filed on Nov. 10, 2008, provisional application No. 61/140,812, filed on Dec. 24, 2008.

(51) Int. Cl.
| | | |
|---|---|---|
| G06F 17/50 | (2006.01) | |
| G03F 1/00 | (2012.01) | |
| G03F 7/20 | (2006.01) | |
| G03F 1/44 | (2012.01) | |

(52) U.S. Cl.
CPC .............. *G06F 17/5009* (2013.01); *G03F 1/14* (2013.01); *G03F 7/705* (2013.01); *G03F 7/70433* (2013.01); *G03F 1/44* (2013.01)
USPC .......................................................... 703/6

(58) Field of Classification Search
CPC ...................................................... G06F 7/705
USPC ............................................. 703/6; 356/4.02
See application file for complete search history.

(56) References Cited

U.S. PATENT DOCUMENTS

| | | | |
|---|---|---|---|
| 5,969,441 | A | 10/1999 | Loopstra et al. |
| 6,046,792 | A | 4/2000 | Van Der Werf et al. |

(Continued)

FOREIGN PATENT DOCUMENTS

| | | |
|---|---|---|
| JP | 2007-507890 | 3/2007 |
| JP | 2009-505400 | 2/2009 |
| WO | 2008/151185 | 12/2008 |

OTHER PUBLICATIONS

Chris Spence, "Full-Chip Lithography Simulation and Design Analysis—How OPC is changing IC Design," Proc. of SPIE, vol. 5751, pp. 1-14 (2005).

(Continued)

*Primary Examiner* — Dwin M Craig
(74) *Attorney, Agent, or Firm* — Pillsbury Winthrop Shaw Pittman LLP

(57) ABSTRACT

Methods according to the present invention provide computationally efficient techniques for designing gauge patterns for calibrating a model for use in a simulation process, and which minimize degeneracy between model parameters, and thus maximize pattern coverage for parameter calibration. More specifically, the present invention relates to methods of designing gauge patterns that achieve complete coverage of parameter variations with minimum number of gauges and corresponding measurements in the calibration of a lithographic process utilized to image a target design having a plurality of features. According to some aspects, a method according to the invention includes transforming the space of model parametric space (based on CD sensitivity or Delta TCCs), then iteratively identifying the direction that is most orthogonal to existing gauges' CD sensitivities in this new space, and determining most sensitive line width/pitch combination with optimal assist feature placement which leads to most sensitive CD changes along that direction in model parametric space.

27 Claims, 10 Drawing Sheets

(56) References Cited

U.S. PATENT DOCUMENTS

| | | | |
|---|---|---|---|
| 7,003,758 | B2 | 2/2006 | Ye et al. |
| 7,587,704 | B2 | 9/2009 | Ye et al. |
| 7,882,480 | B2 | 2/2011 | Ye et al. |
| 2005/0140531 | A1* | 6/2005 | Takehana ............... 341/133 |
| 2007/0022402 | A1* | 1/2007 | Ye et al. ................. 716/21 |
| 2007/0031745 | A1* | 2/2007 | Ye et al. ................. 430/30 |
| 2007/0050749 | A1 | 3/2007 | Ye et al. |
| 2007/0213967 | A1* | 9/2007 | Park et al. ............... 703/13 |
| 2007/0260437 | A1* | 11/2007 | Coskun et al. ........... 703/6 |
| 2008/0068667 | A1* | 3/2008 | Tejnil ..................... 358/406 |
| 2008/0068668 | A1* | 3/2008 | Shi et al. ................ 358/406 |
| 2010/0122225 | A1 | 5/2010 | Cao et al. |
| 2010/0146475 | A1 | 6/2010 | Cao et al. |

OTHER PUBLICATIONS

Yu Cao et al., "Optimized Hardware and Software for Fast, Full Chip Simulation," Proc. of SPIE, vol. 5754, No. 1, pp. 407-414 (2004).

International Search Report mailed Feb. 3, 2010 in corresponding International Patent Application No. PCT/US2009/063798.

Yan Wang et al., "A Simple and Practical Approach for Building Lithography Simulation Models Using a Limited Set of CD Data and SEM Pictures," Proc of SPIE, vol. 6521, pp. 65211S-1-65211S-9 (2007).

Shao-Po Wu et al., "Lithography Process Calibration with Applications in Defect Printability Analysis," Proc. of SPIE, vol. 3546, pp. 485-491 (1998).

International Preliminary Report on Patentability dated May 10, 2011 in corresponding International Patent Application No. PCT/US2009/063798.

U.S. Office Action mailed Aug. 14, 2012 in corresponding U.S. Appl. No. 12/613,244.

U.S. Office Action mailed Mar. 1, 2013 in corresponding U.S. Appl. No. 12/613,244.

Japanese Office Action mailed Aug. 3, 2011 in corresponding Japanese Patent Application No. 2009-245323.

U.S. Office Action dated Jul. 30, 2013 in corresponding U.S. Appl. No. 12/613,244.

* cited by examiner

METHODS AND SYSTEMS FOR PARAMETER-SENSITIVE AND ORTHOGONAL GAUGE DESIGN FOR LITHOGRAPHY CALIBRATION

CROSS-REFERENCE TO RELATED APPLICATIONS

The present application claims priority to U.S. Patent Appln. No. 61/113,004, filed on Nov. 10, 2008, and U.S. Patent Appln. No. 61/140,812, filed Dec. 24, 2008, the full contents of each being incorporated herein by reference.

FIELD OF THE INVENTION

The present invention relates generally to designing gauge patterns for calibration associated with a lithography process, and more specifically to computationally efficient methods for designing calibration pattern sets wherein individual patterns have significantly different responses to different parameter variations and are also extremely sensitive to parameter variations, and thus robust against random measurement errors in calibration.

BACKGROUND OF THE INVENTION

Lithographic apparatuses are used, for example, in the manufacture of integrated circuits (ICs). In such a case, the mask contains a circuit pattern corresponding to an individual layer of the IC, and this pattern is imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally <1), the speed V at which the substrate table is scanned will be a factor M times that at which the mask table is scanned. More information with regard to lithographic devices as described herein can be gleaned, for example, from U.S. Pat. No. 6,046,792.

In a manufacturing process using a lithographic projection apparatus, a mask pattern is imaged onto a substrate that is at least partially covered by a layer of radiation-sensitive material (e.g. resist). Prior to this imaging step, the substrate typically undergoes various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer then undergoes various processes such as etching, ion-implantation (e.g. doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (i.e. wafer). These devices are then separated from one another by a technique such as dicing or sawing, whence the individual devices can be mounted on a carrier, connected to pins, etc.

For the sake of simplicity, the projection system is sometimes hereinafter referred to as the "lens"; however, this term should be broadly interpreted as encompassing various types of projection systems, including refractive optics, reflective optics, and catadioptric systems, for example. The radiation system also typically includes components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables can be used in parallel, and/or preparatory steps are carried out on one or more tables while one or more other tables are being used for exposures. Twin stage lithographic apparatus are described, for example, in U.S. Pat. No. 5,969,441.

The photolithographic masks referred to above comprise geometric patterns corresponding to the circuit components to be integrated onto a silicon wafer. The patterns used to create such masks are generated utilizing computer-aided design (CAD) programs, this process often being referred to as electronic design automation (EDA). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. The design rule limitations are typically referred to as "critical dimensions" (CD). A critical dimension of a circuit can be defined as the smallest width of a line or hole or the smallest space between two lines or two holes. Thus, the CD determines the overall size and density of the designed circuit. Of course, one of the goals in integrated circuit fabrication is to faithfully reproduce the original circuit design on the wafer via the mask.

As noted, microlithography is a central step in the manufacturing of semiconductor integrated circuits, where patterns formed on semiconductor wafer substrates define the functional elements of semiconductor devices, such as microprocessors, memory chips etc. Similar lithographic techniques are also used in the formation of flat panel displays, micro-electro mechanical systems (MEMS) and other devices.

As semiconductor manufacturing processes continue to advance, the dimensions of circuit elements have continually been reduced while the amount of functional elements, such as transistors, per device has been steadily increasing over decades, following a trend commonly referred to as "Moore's law". At the current state of technology, critical layers of leading-edge devices are manufactured using optical lithographic projection systems known as scanners that project a mask image onto a substrate using illumination from a deep-ultraviolet laser light source, creating individual circuit features having dimensions well below 100 nm, i.e. less than half the wavelength of the projection light.

This process, in which features with dimensions smaller than the classical resolution limit of an optical projection system are printed, is commonly known as low-$k_1$ lithography, according to the resolution formula $CD = k_1 \times \lambda / NA$, where $\lambda$ is the wavelength of radiation employed (currently in most cases 248 nm or 193 nm), NA is the numerical aperture of the projection optics, CD is the "critical dimension"—generally the smallest feature size printed—and $k_1$ is an empirical resolution factor. In general, the smaller $k_1$, the more difficult it becomes to reproduce a pattern on the wafer that resembles the shape and dimensions planned by a circuit designer in order to achieve particular electrical functionality and performance. To overcome these difficulties, sophisticated fine-tuning steps are applied to the projection system as well as to the mask design. These include, for example, but not limited to, optimization of NA and optical coherence settings, customized illumination schemes, use of phase shifting masks, optical proximity correction in the mask layout, or other methods generally defined as "resolution enhancement techniques" (RET).

As one important example, optical proximity correction (OPC, sometimes also referred to as optical and process correction) addresses the fact that the final size and placement of a printed feature on the wafer will not simply be a function of the size and placement of the corresponding feature on the mask. It is noted that the terms "mask" and "reticle" are utilized interchangeably herein. For the small feature sizes and high feature densities present on typical circuit designs, the position of a particular edge of a given feature will be influenced to a certain extent by the presence or absence of other adjacent features. These proximity effects arise from minute amounts of light coupled from one feature to another. Similarly, proximity effects may arise from diffusion and other chemical effects during post-exposure bake (PEB), resist development, and etching that generally follow lithographic exposure.

In order to ensure that the features are generated on a semiconductor substrate in accordance with the requirements of the given target circuit design, proximity effects need to be predicted utilizing sophisticated numerical models, and corrections or pre-distortions need to be applied to the design of the mask before successful manufacturing of high-end devices becomes possible. The article "Full-Chip Lithography Simulation and Design Analysis-How OPC Is Changing IC Design", C. Spence, Proc. SPIE, Vol. 5751, pp 1-14 (2005) provides an overview of current "model-based" optical proximity correction processes. In a typical high-end design, almost every feature edge requires some modification in order to achieve printed patterns that come sufficiently close to the target design. These modifications may include shifting or biasing of edge positions or line widths as well as application of "assist" features that are not intended to print themselves, but will affect the properties of an associated primary feature.

The application of model-based OPC to a target design requires good process models and considerable computational resources, given the many millions of features typically present in a chip design. However, applying OPC is generally not an exact science, but an iterative process that does not always resolve all possible weaknesses on a layout. Therefore, post-OPC designs, i.e. mask layouts after application of all pattern modifications by OPC and any other RET's, need to be verified by design inspection, i.e. intensive full-chip simulation using calibrated numerical process models, in order to minimize the possibility of design flaws being built into the manufacturing of a mask set. This is driven by the enormous cost of making high-end mask sets, which run in the multi-million dollar range, as well as by the impact on turn-around time by reworking or repairing actual masks once they have been manufactured.

Both OPC and full-chip RET verification may be based on numerical modeling (i.e. computational lithography) systems and methods as described, for example in, U.S. Pat. No. 7,003,758 and an article titled "Optimized Hardware and Software For Fast, Full Chip Simulation", by Y. Cao et al., Proc. SPIE, Vol. 5754, 405 (2005).

As mentioned above, both OPC and RET require robust models that describe the lithography process precisely. Calibration procedures for such lithography models are thus required to achieve models that are valid, robust and accurate across the process window. Currently, calibration is done by actually printing a certain number of 1-dimensional and/or 2-dimensional gauge patterns on a wafer and performing measurements on the printed patterns. More specifically, those 1-dimensional gauge patterns are line-space patterns with varying pitch and CD, and the 2-dimensional gauge patterns typically include line-ends, contacts, and randomly selected SRAM (Static Random Access Memory) patterns. These patterns are then imaged onto a wafer and resulting wafer CDs or contact hole (also known as a via or through-chip via) energy are measured. The original gauge patterns and their wafer measurements are then used jointly to determine the model parameters which minimize the difference between model predictions and wafer measurements.

A model calibration process as described above and used in the prior art is illustrated in FIG. 3. In the prior art model calibration (FIG. 3), the process begins with a design layout 302, which can include gauges and other test patterns, and can also include OPC and RET features. Next, the design is used to generate a mask layout in step 304, which can be in a standard format such as GDSII or OASIS. Then two separate paths are taken, for simulation and measurement.

In a simulation path, the mask layout and a model 306 are used to create a simulated resist image in step 308. The model 306 provides a model of the lithographic process for use in computational lithography, and the calibration process aims to make the model 306 as accurate as possible, so that computational lithography results are likewise accurate. The simulated resist image is then used to determine predicted critical dimensions (CDs), contours, etc. in step 310.

In a measurement path, the mask layout 304 is used to form a physical mask (i.e. reticle), which is then imaged onto a wafer in step 312. The lithographic process (e.g. NA, focus, dose, illumination source, etc.) used to image the wafer is the same as that intended to be captured in model 306. Measurements (e.g. using metrology tools, etc.) are then performed on the actual imaged wafer in step 314, which yields measured CDs, contours, etc.

A comparison is made in step 316 between the measurements from step 314 and the predictions from step 310. If the comparison determines that the predictions match the measurements within a predetermined error threshold, the model is considered to be successfully calibrated in step 318. Otherwise, changes are made to the model 306, and steps 308, 310 and 316 are repeated until the predictions generated using the model 306 match the measurements within a predetermined threshold.

The inventors have noted that the design of gauge patterns such as those included in design layout 302 can greatly affect the accuracy of the model 306 and/or the time needed to successfully complete the calibration process. Unfortunately, the conventional art does not include a systematic study on how to determine the type or design of gauge patterns to be used for calibration. For example, there is no theoretical guidance on the choice of pitch and CD for the line-space patterns or the number of gauges. In current practice, the selection of gauge patterns is rather arbitrary—they are often chosen from experience or randomly chosen from the real circuit patterns. Such gauge patterns are often incomplete or super-complete or both for calibration. For example, none of the chosen gauge patterns will effectively discriminate between certain of the model parameters, thus it may be difficult to determine the parameter values due to measurement inaccuracies. On the other hand, many patterns can yield very similar responses to different parameter variations, thus some of them are redundant and wafer measurements on these redundant patterns waste resources.

SUMMARY OF THE INVENTION

The present invention relates to computationally efficient techniques for designing gauge patterns for calibrating a lithographic process model for use in a simulation process. According to some aspects, the present invention relates to methods of designing gauge patterns that are extremely sensitive to parameter variations, and thus robust against random measurement errors in calibration of a lithographic process utilized to image a target design having a plurality of features. In some embodiments, the process includes identifying a most sensitive line width/pitch combination with optimal assist feature placement which leads to most sensitive CD changes against parameter variations. Another process includes designing gauges which have two main features. The difference between the two main features' CDs is extremely sensitive against parameter variation, and thus robust against random measurement error and any measurement error in bias. In yet another process, patterns are designed that lead to most sensitive intensity.

According to further aspects, the invention includes methods for designing gauges which minimize the above-described degeneracy, and thus maximize pattern coverage for model calibration. More specifically, the present invention relates to methods of designing gauge patterns that achieve complete coverage of parameter variations with minimum number of gauges and corresponding measurements in the calibration of a lithographic process model utilized to simulate imaging of a target design having a plurality of features. According to some aspects, a method according to the invention includes transforming a model parametric space into a new space (based on CD sensitivity or Delta TCCs), then iteratively identifying the direction that is most orthogonal to existing gauges' CD sensitivities in this new space, and determining a most sensitive line width/pitch combination with optimal assist feature placement which leads to most sensitive CD changes along that direction in a model parametric space.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

Figure 1:
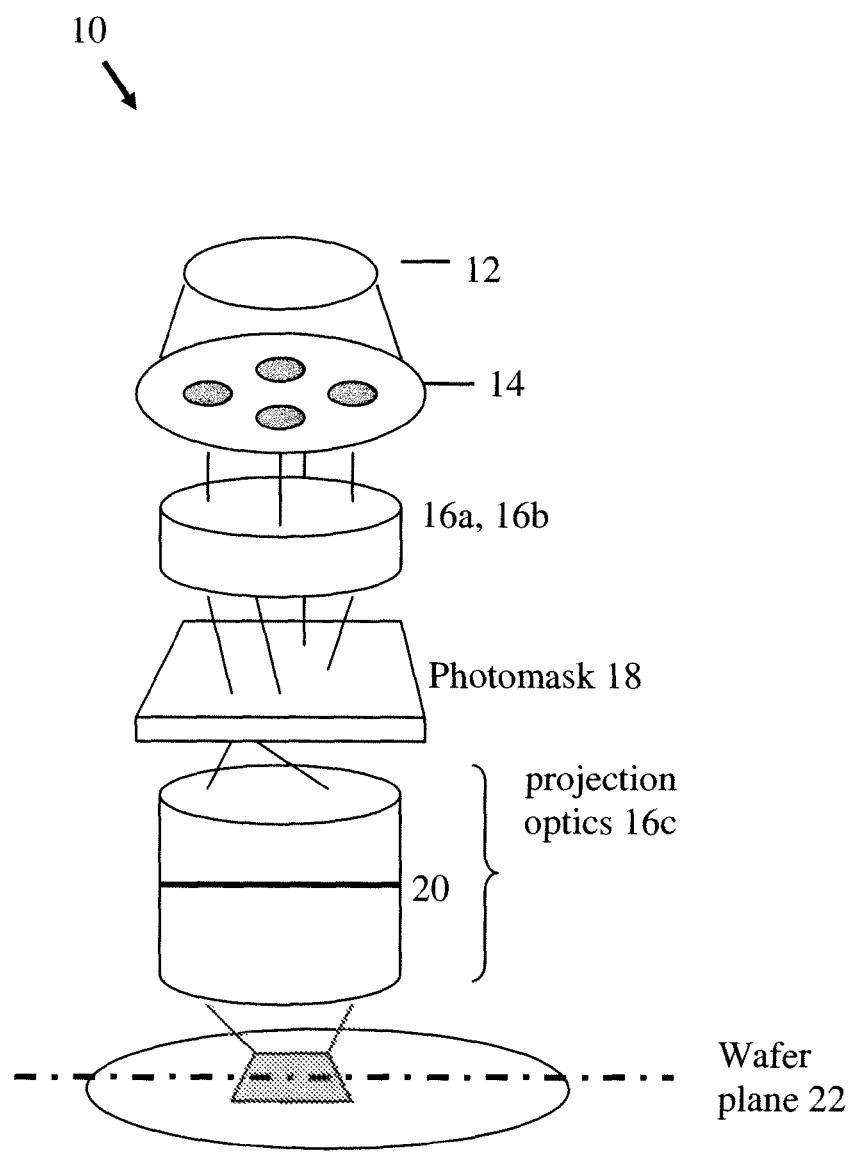
FIG. 1 is an exemplary block diagram illustrating a typical lithographic projection system.

Prior to discussing the present invention, a brief discussion regarding the overall simulation and imaging process to be calibrated is provided. FIG. 1 illustrates an exemplary lithographic projection system 10. The major components are a light source 12, which may be a deep-ultraviolet excimer laser source, illumination optics which define the partial coherence (denoted as sigma) and which may include specific source shaping optics 14, 16a and 16b; a mask or reticle 18; and projection optics 16c that produce an image of the reticle pattern onto the wafer plane 22. An adjustable filter or aperture 20 at the pupil plane may restrict the range of beam angles that impinge on the wafer plane 22, where the largest possible angle defines the numerical aperture of the projection optics $NA = \sin(\Theta_{max})$.

Figure 2:
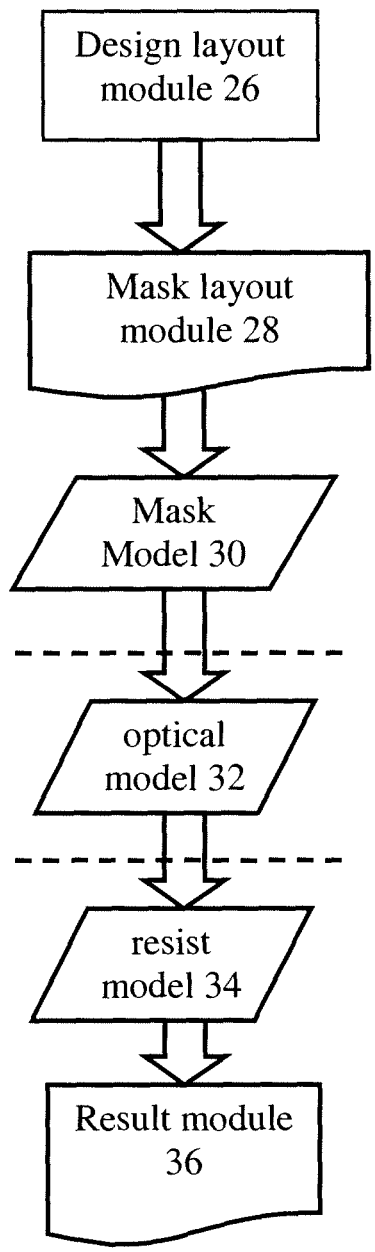
FIG. 2 is an exemplary block diagram illustrating the functional modules of a lithographic simulation model.
Figure 3:
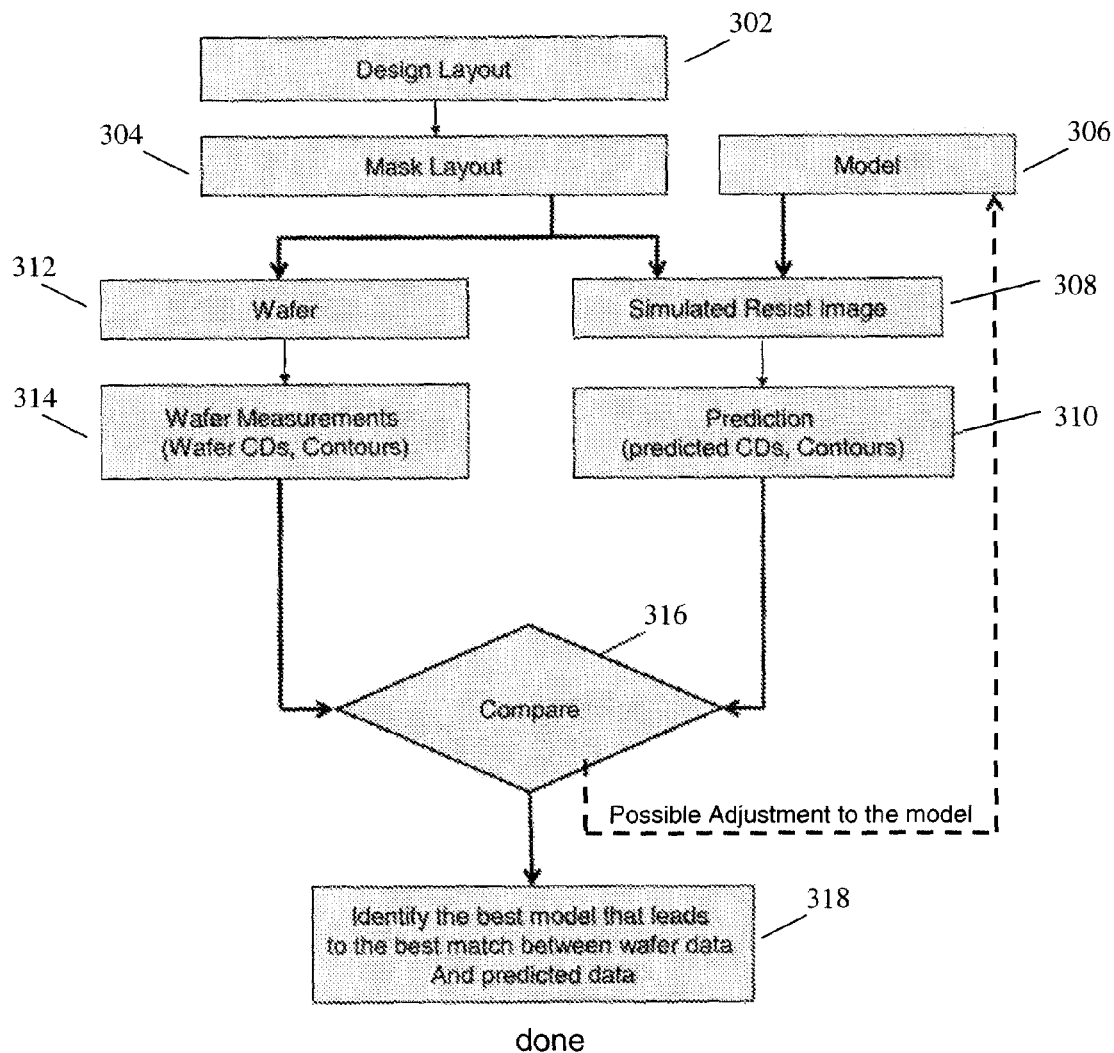
FIG. 3 is an exemplary block diagram illustrating a prior art lithographic calibration process.

In a lithography simulation system, these major system components can be described by separate functional modules, for example, as illustrated in FIG. 2. Referring to FIG. 2, the functional modules include the design layout module 26, which defines the target design; the mask layout module 28, which defines how the mask is laid out in polygons based on the target design; the mask model module 30, which models the physical properties of the pixilated and continuous-tone mask to be utilized during the simulation process; the optical model module 32, which defines the performance of the optical components of lithography system; and the resist model module 34, which defines the performance of the resist being utilized in the given process. As is known, the result of the simulation process produces, for example, predicted contours and CDs in the result module 36.

More specifically, it is noted that the properties of the illumination and projection optics are captured in the optical model module 32 that includes, but is not limited to, NA-sigma (σ) settings as well as any particular illumination source shape, where σ (or sigma) is outer radial extent of the illuminator. The optical properties of the photo-resist layer coated on a substrate—i.e. refractive index, film thickness, propagation and polarization effects—may also be captured as part of the optical model module 32, whereas the resist model module 34 describes the effects of chemical processes which occur during resist exposure, PEB and development, in order to predict, for example, contours of resist features formed on the substrate wafer. The mask model module 30 captures how the target design features are laid out in the reticle and may also include a representation of detailed physical properties of the mask, as described, for example, in U.S. Pat. No. 7,587,704. The objective of the simulation is to accurately predict, for example, edge placements and critical dimensions (CDs), which can then be compared against the target design. The target design is generally defined as the pre-OPC mask layout, and will be provided in a standardized digital file format such as GDSII or OASIS.

In general, the connection between the optical and the resist model is a simulated aerial image intensity within the resist layer, which arises from the projection of light onto the substrate, refraction at the resist interface and multiple reflections in the resist film stack. The light intensity distribution (aerial image intensity) is turned into a latent "resist image" by absorption of photons, which is further modified by diffusion processes and various loading effects. Efficient simulation methods that are fast enough for full-chip applications approximate the realistic 3-dimensional intensity distribution in the resist stack by a 2-dimensional aerial (and resist) image.

As should be therefore apparent from the above, the model formulation describes all of the known physics and chemistry of the overall process, and each of the model parameters preferably corresponds to a distinct physical or chemical effect. The model formulation thus sets an upper bound on how well the model can be used to simulate the overall lithography process. However, sometimes the model parameters may be inaccurate from measurement and reading errors, and there may be other imperfections in the system. With precise calibration of the model parameters, extremely accurate simulations can be done. In other words, the calibration of modern models is probably a larger factor in accuracy than the theoretical upper bound of accuracy.

There are various ways that the model parameters can be expressed. One efficient implementation of a lithography model is possible using the following formalism, where the image (here in scalar form, but which may be extended to include polarization vector effects) is expressed as a Fourier sum over signal amplitudes in the pupil plane. According to the standard Hopkins theory, the aerial image (AI) intensity may be defined by:

$$
\begin{aligned}
I(x) &= \sum_k \left| A(k) \sum_{k'} M(k'-k) P(k') \exp(-jk'x) \right|^2 \quad \text{(Eq. 1)} \\
&= \sum_k A(k)^2 \left\{ \sum_{k'} \sum_{k''} M(k'-k) P(k') M^*(k''-k) P^*(k'') \exp(-j(k'-k'')x) \right\} \\
&= \sum_{k'} \sum_{k''} \left[ \sum_k A(k)^2 P(k+k') P^*(k+k'') \right] \\
&\quad M(k') M^*(k'') \exp(-j(k'-k'')x) \\
&= \sum_{k'} \sum_{k''} TCC_{k',k''} M(k') M^*(k'') \exp(-j(k'-k'')x)
\end{aligned}
$$

where I (x) is the aerial image intensity at point x within the image plane (for notational simplicity, a two-dimensional coordinate represented by a single variable is utilized), k represents a point on the source plane, A (k) is the source amplitude from point k, k' and k" are points on the pupil plane, M is the Fourier transform of the mask image, P is the pupil function (M* and P* are the complex conjugates of M and P, respectively).

An important aspect of the foregoing derivation is the change of summation order (moving the sum over k inside) and indices (replacing k' with k+k' and replacing k" with k+k"), which results in the separation of the Transmission Cross Coefficients (TCCs), defined by the term inside the square brackets in the third line in the equation and as shown in the fourth line, from the other terms. In other words:

$$TCC_{k',k''} = \Sigma_k A(k)^2 P(k+k') P^*(k+k'').$$

These transmission cross coefficients are independent of the mask pattern and therefore can be pre-computed using knowledge of the optical elements or configuration only (e.g., NA and σ or the detailed illuminator profile). It is further noted that although in the given example (Eq. 1) is derived from a scalar imaging model for ease of explanation, those skilled in the art can also extend this formalism to a vector imaging model, where TE and TM polarized light components are summed separately.

For simplicity, note that the relationship between aerial image intensity and TCCs, i.e., (Eq. 1) can be expressed as a bilinear operator:

$$I(x) = M^* TCC^* M^*$$

Furthermore, the approximate aerial image intensity I can be calculated by using only a limited number of dominant TCC terms, which can be determined by diagonalizing the TCC matrix and retaining the terms corresponding to its largest eigenvalues, i.e., $$TCC_{k',k''} = \sum_{n=1}^{N} \lambda_n \phi_n(k') \phi_n^*(k'') \quad \text{(Eq. 2)}$$

where $\lambda_n$ (n=1, . . . , N) denotes the N largest eigenvalues and $\phi_n(\bullet)$ denotes the corresponding eigenvector of the TCC matrix. It is noted that (Eq. 2) is exact when all terms are retained in the eigenseries expansion, i.e., when N is equal to the rank of the TCC matrix. However, in actual applications, it is typical to truncate the series by selecting a smaller N to increase the speed of the computation process.

Thus, (Eq. 1) can be rewritten as:

$$I(x) = \sum_{k'} \sum_{k''} TCC_{k',k''} M(k') M(k'') \exp(j(k'-k'')x) \quad \text{(Eq. 3)}$$

$$= \sum_{k'} \sum_{k''} \sum_{n=1}^{N} \lambda_n \phi_n(k') \phi_n^*(k'') M(k') M^*(k'') \exp(j(k'-k'')x)$$

$$= \sum_{n=1}^{N} \lambda_n \sum_{k'} \phi_n(k') M(k') \exp(jk'x)$$

$$\sum_{k''} \phi_n^*(k'') M^*(k'') \exp(-jk''x)$$

$$= \sum_{n=1}^{N} \lambda_n |\Phi_n(x)|^2$$

where $$\Phi_n(x) = \sum_{k''} \phi_n(k'') M^*(k'') \exp(jk''x)$$

and $|\bullet|$ denotes the magnitude of a complex number.

As should be apparent from the above, the lithography simulation model parameters are captured in the TCCs. Accordingly, calibrating model parameters in embodiments of the invention is achieved by obtaining highly accurate raw TCC terms (i.e. before diagonalization). However, the invention is not limited to this example embodiment.

Univariate Parameter-Sensitive Calibration Pattern Set Design

Note that a gauge comprises one or more calibration patterns. When there are more than one calibration pattern in one gauge, the multiple patterns are typically duplicates of the same pattern. This allows users to take several measurements and then perform averaging to reduce random measurement error.

In first embodiments of the invention, gauge design methods are provided to maximize sensitivity of a given metric against variations in a single parameter. When the sensitivity is maximized, the robustness against random measurement error is also maximized, which minimizes the number of measurements. To further illustrate this point, consider the following example. Assume that parameter P is calibrated from CD measurements, as in a typical calibration process. Suppose the true value of P is $P_0$, and the value of P is estimated from L gauges. Further assume using a brute-force approach to calibrate parameter P, i.e., there are a set $S_P$ of possible values for P, denoted as $$S_P = \{P_0, P_1, P_2, \ldots\}$$

For every element $P' \in S_P$, the resulting CD, denoted as $CD_l(P')$ can be simulated for the l-th calibration pattern (l=1, . . . , L), for example using the numerical modeling systems and methods as described in U.S. Pat. No. 7,003,758 and an article titled "Optimized Hardware and Software For Fast, Full Chip Simulation", by Y. Cao et al., Proc. SPIE, Vol. 5754, 405 (2005), Next the error between measured CDs and the simulated CDs is computed for every $P' \in S_P$, and the value $P^*$ is chosen that minimizes the error among all elements in $S_P$. Typically Mean Squared Error (MSE) is used to measure such error, in which case $P^*$ can then be formulated as $$P^* = \arg\min_{P' \in S_P} \frac{1}{L} \sum_{l=1}^{L} (\tilde{CD}_l - CD_l(P'))^2 \quad \text{(Eq. 4)}$$

where $\tilde{CD}_l$ is the measured CD value of the l-th gauge (l=1, . . . , L), and the function arg min (or arg max) represents the argument of the minimum (or maximum), i.e., the value of the given argument for which the value of the given object function achieves its minimum (or maximum).

In the ideal world where there is no CD measurement error, and the computation of $CD_l(P')$ is carried out perfectly without any approximation or numerical error, such that $$\tilde{CD}_l = CD_l(P_0)$$

for all L gauges, and $P' = P_0$ will always lead to the minimum error (0) between the measured CDs and simulated CDs from the true parameter value.

Unfortunately, in real applications, there is always some (random) deviation between the measured CDs and the simulated CDs. Then for the l-th gauge (l=1, . . . , L), the measured CD value is $$\tilde{CD}_l = CD_l(P_0) + E_l$$

where $E_l$ is the deviation for the l-th gauge.

For small parameter variations, it can be assumed that the relationship between CD and P is linear, i.e., for the l-th gauge, $$CD_l(P) = CD_l(P_0) + K_l(P - P_0)$$

as disclosed in U.S. Patent Publ. No. 2009/0157360, commonly owned by the present assignee. Here the CD sensitivity (i.e. one example of a metric) against parameter P is defined as:

$$K_l = \frac{\partial CD_l(P)}{\partial P} \bigg|_{P=P_0}$$

which is a constant for each gauge when the variation of P is small. In this case, (Eq. 4) can be written as $$P^* = \arg\min_{P' \in S_P} \frac{1}{L} \sum_{l=1}^{L} (\tilde{CD}_l - CD_l(P'))^2$$

$$= \arg\min_{P' \in S_P} \frac{1}{L} \sum_{l=1}^{L} (K_l(P' - P_0) - E_l)^2$$

-continued $$= \arg\min_{P' \in S_p} \frac{1}{L}\left[(P'-P_0)^2 \sum_{l=1}^{L} K_l^2 - 2(P'-P_0)\sum_{l=1}^{L}(K_l E_l) + \sum_{l=1}^{L} E_l^2\right]$$

Taking the derivative of the expression inside the square brackets above with respect to P' and setting it to zero results in the following equation:

$$2(P^* - P_0)\sum_{l=1}^{L} K_l^2 - 2\sum_{l=1}^{L}(K_l E_l) = 0$$

Therefore, $$P^* = P_0 + \frac{\sum_{l=1}^{L}(K_l E_l)}{\sum_{l=1}^{K} K_l^2}. \quad \text{(Eq. 5)}$$

As can be noticed, because of the $E_l$ term, the calibration value of the parameter is no longer its true value $P_0$. The calibration error is denoted as $$\Delta_P = \frac{\sum_{l=1}^{L}(K_l E_l)}{\sum_{l=1}^{L} K_l^2}.$$

From (Eq. 5), it can be seen that the smaller $\Delta_P$, the better the calibration result. If the absolute value of the CD sensitivity $K_l$ can be increased, the calibration error can be reduced. For example, if the CD sensitivity for each gauge is increased to $NK_l$, then the calibration error is reduced to 1/N of the original. Or vice verse, if it is desired to maintain the same calibration precision, one can reduce the number of gauges and number of CD measurements, which results in lower cost. One can also do a simple probability analysis on (Eq. 5) where it is assumed that such deviation is an additive random variable with mean 0 and variance $\sigma^2$ and independent of each other. One can further assume that all the features have same CD sensitivity $K_l$, i.e., $K_l=K$, for $l=1, \ldots, L$. Thus, $$\Delta_P = \frac{\sum_{l=1}^{L} E_l}{KL}$$

Then the variance of calibration error is $$E(\Delta_P^2) = \frac{\sum_{l=1}^{L} E(E_l^2)}{K^2 L^2} = \frac{\sigma^2}{K^2 L}$$

Again, increasing CD sensitivity of each pattern will reduce the variance of the calibration error.

Next, the concepts of Delta I and Delta TCC are introduced herein. More particularly, given a nominal condition, the nominal TCC, nominal aerial image intensity and nominal CD can be computed. To study the CD sensitivity, a small perturbation is added to a certain parameter, and then the CD change (or Delta CD) under such parameter perturbation is studied. Suppose the nominal TCC is $TCC_{NC}$, then the nominal aerial image intensity $I_{NC}$ is $$I_{NC} = M^* TCC_{NC} * M^*$$

from (Eq. 1).

Then suppose the TCC with parameter p perturbed is $TCC_p$, then the perturbed aerial image intensity $I_p$ is:

$$I_p = M^* TCC_p * M^*.$$

In example embodiments described below, the focus is on aerial image CD change (i.e. CD sensitivity is the observed metric). Therefore, the focus can be on aerial image intensity change near the aerial image threshold point, as explained in more detail below. If a gauge has a large aerial image intensity change near the threshold point when the parameter is perturbed, it is very likely that it also has a large CD sensitivity against that parameter variation.

To further simplify the problem, the difference between the perturbed aerial image intensity (which corresponds to perturbed parameter values) and nominal aerial image intensity (which corresponds to nominal parameter values) is studied. This is called the Delta I or $\Delta I_p$, i.e., $$\Delta I_p = I_p - I_{NC} = M^*(TCC_p - TCC_{NC})*M^*$$

The term Delta TCC refers to the term in parentheses above, i.e.:

$$\Delta TCC_p = TCC_p - TCC_{NC}$$

Delta TCC (i.e. $\Delta TCC_p$ in the equation above) is computed by taking the element-by-element matrix difference between $TCC_p$ and $TCC_{NC}$. It should be noted that Delta TCC (i.e. $\Delta TCC_p$), $TCC_p$ and $TCC_{NC}$ are all in "raw" matrix form, before any diagonalization.

Then the Delta I can be viewed as an aerial image intensity resulting from the Delta TCC and the original mask image, i.e., the bilinear operator on the mask image and the Delta TCC. In an embodiment, similar to (Eq. 2) and (Eq. 3), eigen-decomposition of the Delta TCC is performed to speed up the computation of Delta I. In the embodiment, the eigenvalues of the Delta TCC may be negative, so the eigenvalues with largest absolute values should be kept.

Figure 4:
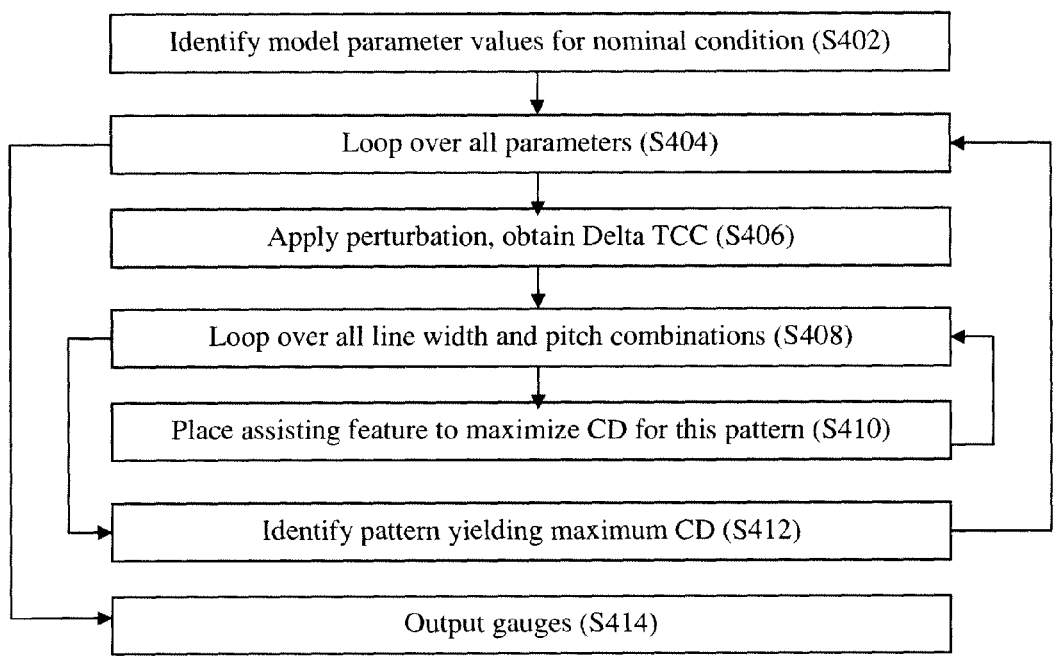
FIG. 4 is a flowchart of an exemplary method for designing parameter sensitive gauges according to embodiments of the invention.

With this foundation, various embodiments for designing 1D maximum sensitive test gauges according to the invention will now be described. In a first example embodiment, the methodology includes finding a line/space pattern and associated assist features that maximize sensitivity for each parameter. A general description of this embodiment will be provided in connection with the flowchart in FIG. 4. However, further details of this and alternative embodiments will be provided following the description of FIG. 4.

First, in step S402, a nominal condition setting is identified, which is a set of parameter values for all relevant parameters. Next in step S404, a loop begins for each parameter. First, in step S406, a perturbation value for the parameter is applied, typically a small amount which yields a Delta TCC as described above. In some embodiments, the perturbation value is an amount that will cause the CD change of the most important pattern to be around 10 nm. Here, use is made of the fact that the relationship between CD change and small parameter variations is quite linear. Also, the CD sensitivity of a given pattern is defined as the difference between the nominal CD value and the perturbed CD value, i.e., the CD value when that particular parameter value is the sum of its nominal value and a perturbation. As set forth above, this can be inherently identified from the Delta I resulting from this Delta TCC.

So far, the actual design of the calibration patterns is not yet involved, as previous steps concentrated on the imaging. In step S408, a loop begins for each possible or allowed value of the parameters (such as line width or pitch of a calibration grating). In step S410, for the current line/space pattern, place an assisting feature to maximize the CD sensitivity against that parameter. Next, after looping over all possible main feature line width and pitch combinations (including the opposite tones) as described in more detail below, in step S412, the combination leading to the maximum (absolute) CD sensitivity is identified. This combination corresponds to a calibration pattern for a perturbed state. When used in combination with the calibration pattern corresponding to the nominal values of the parameters, the model can be calibrated.

After optimal calibration patterns with assisting features have been generated for all parameters, the set of resulting calibration patterns are output in step S414. This set includes a calibration pattern according to the nominal parameters to enable comparison. By using the same nominal values for all parameters, only a single calibration pattern can be used for respectively calibrating all parameters. In an embodiment, a plurality of calibration patterns is used to allow multiple measurements to be taken in order to improve accuracy of the calibration.

In this embodiment, it is assumed that the changes in aerial image intensity and thus the aerial image CD is representative of the changes in wafer CD. In terms of the model (e.g. FIG. 2), the resist model 34 is not used (as explained above, the connection between the optical model and the resist model is a simulated aerial image intensity within the resist layer.) Thus, one can identify the optimal assisting feature locations in step S410 purely based on TCCs. This assumption reduces the design complexity considerably, as will become more apparent from the descriptions below.

Further, the exhaustive search of the most sensitive calibration pattern sets over all possible main feature line width and pitch as set forth in step S408 may be too expensive. Accordingly, embodiments of the invention employ a few approximations to reduce the computational complexity.

First, for identifying the optimal main feature pitch, the present inventors recognize through simulations that it is not necessary to loop through all possible pitch values in step S408. The reason is, for each gauge, if only the central main feature is measured, other main features can also be viewed as assisting features to the central feature. Thus, it is theoretically optimal to start with an infinite pitch, i.e., an isolated main feature or a line space pattern with a very large pitch. This is also consistent with the observation that if the assisting feature placement methodology is optimal, then the more space to place assisting features, the higher the CD sensitivity, because more assisting features are contributing to the sensitivity. However, in real applications, it is often preferred that a gauge contains a few repetitive main features, so that measurements can be taken at different locations then averaged in order to reduce (random) measurement error. Thus it is desired to have a pitch ¼ or ⅕ of the gauge width (which is typically a few micrometers), so that the pitch is still quite large and four or five measurements can be taken for each gauge.

For the identification of most sensitive main feature line width, the present inventors recognize that it is possible to separate the process of identifying most sensitive CD from the process of adding assisting features without hurting the performance. More particularly, they note that it is reasonable to assume that the line width having the most sensitive CD without any assisting feature, when added with assisting features, is close to the line width having the most sensitive CD with assisting features. Accordingly, another approximation is to first search the most sensitive main feature CD without any assisting feature, and then add assisting features to the isolated main feature with that CD value.

The present inventors further recognize that it is also possible to pre-determine the most optimal line width for the main feature without an exhaustive search. Suppose the delta TCC matrix for a 2D image is $\Delta TCC(k_{x1}, k_{y1}, k_{x2}, k_{y2})$ The Delta TCC matrix for a 1D Line Space pattern can be recomposed as $\Delta TCC(k_{x1}, k_{x2}) = \Delta TCC(k_{x1}, 0, k_{x2}, 0)$, and the corresponding kernel in the image plane is $\Delta W(x, y)$. The indices $k_{x1}, k_{y1}, k_{x2}, k_{y2}$ are the two-dimensional indices corresponding to the frequency-domain indices k', k" as set forth above.

Then, by changing (Eq. 1) from pupil plane to image plane, or equivalently, changing from the frequency domain to the spatial domain using an inverse Fourier transform process, the Delta I for a Line Space mask pattern M(x) becomes $$\Delta I(x) = \iint M(\xi_1) M^*(\xi_2) \Delta W(x-\xi_1, x-\xi_2) d\xi_1 d\xi_2$$

Assume that the line width in pattern M(x) is LW, i.e., M(x) is an isolated line with width of LW. Further, without loss of generality, assume a darkfield mask without attenuation (the results for other scenarios are very similar), then $$M(x) = \begin{cases} 1 & \text{if } |x| \leq LW/2 \\ 0 & \text{otherwise} \end{cases}$$

The method above is only interested in the aerial image intensity near an aerial image threshold. This threshold corresponds to a minimum intensity to be received by the resist layer (photoactive layer) used in the lithographic process before it is activated. Here, for simplicity, it can be assumed that that point is close to the two mask image edge locations, $x = \pm LW/2$. Further, because of symmetry, one need only look at the single point $x = LW/2$, i.e., one can focus on $\Delta I(LW/2)$, which can be simplified as $$\Delta I(LW/2) = \int_{\xi_1 = -LW/2}^{LW/2} \int_{\xi_2 = -LW/2}^{LW/2} \Delta W(LW/2 - \xi_1, LW/2 - \xi_2) d\xi_1 d\xi_2$$
$$= \int_{\xi_1 = 0}^{LW} \int_{\xi_2 = 0}^{LW} \Delta W(\xi_1, \xi_2) d\xi_1 d\xi_2$$

This formula relates the CD sensitivity, as expressed by $\Delta I$ (LW/2), to the line width LW of the main feature, and thus enables the determination of the line width that maximizes the CD sensitivity. Accordingly, with the process for determining optimal line width and pitch being simplified as set forth above, steps S408 to S412 of the general methodology for calibration pattern design described in connection with FIG. 4 can be implemented by identifying the most sensitive line width and pitch for a given parameter (for both opposite tones) using the above equation, and, for the main features with identified line width and pitch, place assisting features to maximize the CD sensitivity against that parameter.

For this latter step, the present inventors have further developed advantageous methods for placing assisting features to maximize the CD sensitivity for a given main feature. In embodiments, this includes identifying an Assisting Feature Guidance Map (AFGM), which is similar to the SGM described in the PCT application published as WO 2008-151185. The following describes two alternative methods to compute AFGM.

The first method is called a single kernel approach. From (Eq. 3), one can also express the Delta I computation in the space domain as:

$$\Delta I = L_1 * (M \otimes F_1)^2 + L_2 * (M \otimes F_2)^2 + \ldots + L_N * (M \otimes F_N)^2$$

where: M is the mask image in the space domain (which is typically real); N is the number of eigenvalues of the Delta TCC; $F_1$ to $F_N$ are the real-space filters corresponding to each TCC term (i.e., the real part of the inverse Fourier Transform of $\phi_1$ to $\phi_N$); $L_1$ to $L_N$ are the corresponding eigenvalues of each Delta TCC term; "$\otimes$" means convolution, and "*" is the regular multiplication. One can assume without loss of generality that $|L_1| \geq |L_2| \ldots \geq |L_N|$.

In the single kernel approach, the emphasis is on the aerial image intensity from the kernel corresponding to the eigenvalues with the largest absolute value. Then by ignoring the scaling factor $L_1$:

$$\Delta I \approx (M \otimes F)^2$$

where $F=F(x,y)$ is a scalar field, and can be well approximated by $F_1$ in the "near-coherent" case, i.e., $|L_n|/|L_1| \ll 1$, for any $n=2, 3, \ldots, N$.

For each field point x' on the mask, this approach places a hypothetical point source $\delta(x-x')$ as an assisting feature and studies the contribution from this point source to the change in aerial image intensity Delta I around the mask edges. If the contribution is positive, then it implies that the change (Delta AI or ΔI) in aerial image intensity will increase if the assisting features contain this point. This means that adding this point to the assist features for the calibration pattern corresponding to the perturbed parameter values contributes to the sensitivity of the set of calibration patterns to parameter changes. Thus, the assist features for the calibration pattern corresponding to the perturbed parameter values should comprise this point.

For each field point x', the change (Delta I) in aerial image intensity with the point source is $$\Delta I_{x'} = ((M + \delta(x-x')) \otimes F)^2$$

Note that the convolution operation is linear, thus the change related to the field point in the change (Delta I) related to different parameter values in aerial image intensity, caused by placing the point source is $$\Delta I_{x'} - \Delta I = ((M + \delta(x-x')) \otimes F)^2 - (M \otimes F)^2$$

$$= 2(\delta(x-x')) \otimes F)(M \otimes F) + (\delta(x-x')) \otimes F)^2$$

$$= 2F(x-x')(M \otimes F) + (F(x-x'))^2$$

Assuming a real mask, then the AFGM, which is the point source's contribution to all mask edge locations, is $$AFGM(x') = \int_x \left| \frac{dM(x)}{dx} \right| [\Delta I_{x'} - \Delta I] dx$$

$$= \int_x \left| \frac{dM(x)}{dx} \right| [2F(x-x')(M \otimes F) + (F(x-x'))^2] dx$$

$$= 2 \left( \left| \frac{dM(x)}{dx} \right| (M \otimes F) \right) \otimes F(-x) + \left| \frac{dM(x)}{dx} \right| \otimes F^2(-x)$$

With Fourier transforms, one can replace convolutions in the space domain by multiplication in the frequency domain, such that:

$$AFGM(x') = 2IFFT\left\{FFT\left\{\left|\frac{dM(x)}{dx}\right|(M \otimes F)\right\} FFT\{F(-x)\}\right\} + IFFT\left\{FFT\left\{\left|\frac{dM(x)}{dx}\right|\right\} FFT\{F^2(-x)\}\right\}$$

where FFT(.) is the Fourier Transform operation and IFFT(.) is the inverse Fourier Transform operation. One advantageous thing about the frequency domain operation is that $FFT\{F(-x)\}$ and $FFT\{F^2(-x)\}$ are independent of the mask, thus as soon as the optical condition is fixed, they can be pre-computed.

A second embodiment to compute AFGM is called multi-kernel approach. In the multi-kernel approach, mask transmittance M(x) is separated into a pre-OPC component ($M^T$), an assisting feature (AF) component ($M^A$) and an OPC corrections component ($M^C$), i.e.:

$$M(x) = M^T(x) + M^A(x) + M^C(x)$$

If $$M^k(x) = M^T(x) + M^C(x)$$

represents the post-OPC layout transmittance, then by applying the inverse Fourier Transform (i.e., space domain representation) of (Eq. 1), the change in aerial image intensity (Delta I) is $$\Delta I(x) = \int [M^K(x_1) + M^A(x_1)][M^{K*}(x_2) + M^{A*}(x_2)]$$

$$\Delta W(x-x_1, x-x_2) dx_1 dx_2$$

$$= \int [M^K(x_1)M^{K*}(x_2) + M^A(x_1)M^{K*}(x_2) + M^K(x_1)M^{A*}(x_2) + M^A(x_1)M^{A*}(x_2)]$$

$$\Delta W(x-x_1, x-x_2) dx_1 dx_2$$

$$= \Delta I^K(x) + \int [M^A(x_1)M^{K*}(x_2) + M^K(x_1)M^{A*}(x_2)]$$

$$\Delta W(x-x_1, x-x_2) dx_1 dx_2$$

where $\Delta W(x,y)$ is the space domain representation of the Delta TCC and $\Delta I^T(x)$ is the Delta AI change in aerial image intensity (Delta I) without assisting features. In practice, the inventors note that the following term of the above equation can be ignored:

$$\int M^A(x_1) M^{A*}(x_2) \Delta W(x-x_1, x-x_2) dx_1 dx_2$$

Because $M^A$ (associated with the AF component) is typically small compared to $M^K$.

Moreover, to derive the AFGM expression from the remaining terms, a unit source at x' in the AF portion of the mask layout is assumed, i.e., $$M^A(x) = \delta(x-x').$$

This unit source at x' contributes the following amount to the change in aerial image intensity (Delta I) at x:

$$\Delta I(x) - \Delta I^K(x) = \int [M^A(x_1) M^{K*}(x_2) + M^K(x_1) M^{A*}(x_2)]$$
$$\Delta W(x-x_1, x-x_2) dx_1 dx_2$$
$$= \int [\delta(x_1-x') M^{K*}(x_2) + M^K(x_1) \delta(x_2-x')]$$
$$\Delta W(x-x_1, x-x_2) dx_1 dx_2$$
$$= \int M^{K*}(x_2) \Delta W(x-x', x-x_2) dx_2 +$$
$$\int M^K(x_1) \Delta W(x-x_1, x-x') dx_1$$

The weighting of the vote from field point x to source point x' is equal to the gradient of the pre-OPC image, such that $$\frac{dM^R(x)}{dx} = \frac{1}{2} \frac{d}{dx} [M^T(x) + M^{T*}(x)]$$

For AFGM, what needs to be determined is whether this point source, as an assisting feature, would enhance or weaken the change in aerial image intensity (Delta I) from main features only, at all locations near the aerial image intensity threshold. So at each location, the process multiplies the contribution from the point source by the change in aerial image intensity (Delta I) without any assisting feature. After summing this value over all aerial image intensity contour locations, a positive AFGM value implies that this point will enhance the CD sensitivity, and vice versa for a negative value. Assuming an OPC process is performed such that the aerial image intensity contour after OPC matches the pre-OPC edge locations, then one can sum the contributions from the point source over all points where the gradient of the pre-OPC mask image is nonzero. As a result, the AFGM value at x' is equal to For simplicity, let $$R(x) = \left| \frac{dM^R(x)}{dx} \right|^2 \Delta I^K(x)$$

Then with a change of variables, i.e., $x = x' - \zeta_1$, $x_2 = x' - \zeta_2$, for the first integration inside the above brackets and $x_1 = x' - \zeta_1$, $x = x' - \zeta_2$, for the second integration inside the above brackets, then $$V(x') = \int R(x) M^{K*}(x_2) \Delta W(x-x', x-x_2) dx dx_2 +$$
$$\int R(x) M^K(x_1) \Delta W(x-x_1, x-x') dx dx_1 =$$
$$\int R(x'-\xi_1) M^{K*}(x'-\xi_2) \Delta W(-\xi_1, \xi_2-\xi_1) d\xi_1 d\xi_2 +$$
$$\int R(x'-\xi_2) M^K(x'-\xi_1) \Delta W(\xi_1-\xi_2, -\xi_2) d\xi_1 d\xi_2$$

Typically, the mask image $M^K$ is real, thus $$V(x') = \int R(x'-\xi_2) M^K(x'-\xi_1) [\Delta W(-\xi_2, \xi_1-\xi_2) + \Delta W(\xi_1-\xi_2, -\xi_2)] d\xi_1 d\xi_2 \quad \text{(Eq. 6)}$$

The AFGM bilinear kernel (AFGK) can be related to the Delta TCC in the frequency domain:

$$AFGK(k_1, k_2) =$$
$$\int [\Delta W(-\xi_2, \xi_1-\xi_2) + \Delta W(\xi_1-\xi_2, -\xi_2)] \exp(-ik_1\xi_1 + ik_2\xi_2) d\xi_1 d\xi_2 =$$
$$\int \Delta W(\xi'_1, \xi'_2) \exp(-ik_1(\xi'_2-\xi'_1) - ik_2\xi'_1) d\xi'_1$$
$$d\xi'_2 + \int \Delta W(\xi'_1, \xi'_2) \exp(-ik_1(\xi'_1-\xi'_2) - ik_2\xi'_2) d\xi'_1 d\xi'_2 =$$
$$\Delta TCC(k_2-k_1, -k_1) + \Delta TCC(k_1, k_1-k_2)$$

Unlike TCCs, the Hermiticity of the AFGK is no longer guaranteed.

A practical difficulty is that if this formula is used directly, two raw TCCs appear simultaneously, which may be not feasible if the TCC is large (e.g., if each dimension of the TCC is 10⁷ with float data type, then the total memory requirement exceeds 2G bytes). Therefore, it is desirable to make the computation "in-place." To do so, the AFGK can be decomposed as $$TCC_1(k_1, k_2) = \Delta TCC(k_1, -k_2)$$
$$TCC_2(k_1, k_2) = TCC_1(k_1, k_2-k_1) = \Delta TCC(k_1, k_1-k_2)$$
$$AFGK(k_1, k_2) = TCC_2(k_1, k_2) + TCC_2^*(-k_1, -k_2)$$

where each step is in-place.

$$V(x') = \int \left| \frac{dM^R(x)}{dx} \right|^2 \Delta I^K(x) [\Delta I(x) - \Delta I^K(x)] dx = \int \left| \frac{dM^R(x)}{dx} \right|^2 \Delta$$
$$I^K(x) \left[ \int M^{K*}(x_2) \Delta W(x-x', x-x_2) dx_2 + \int M^K(x_1) \Delta W(x-x_1, x-x') dx_1 \right] dx$$

Another practical consideration is that TCCs are typically decomposed into convolution kernels, using an eigen-series expansion for computation speed and storage, because of their Hermiticity. Though AFGK is not necessarily Hermitian, one can apply Singular Value Decomposition (SVD) to it, i.e., $$AFGK(k', k'') = \sum_{n=1}^{N} \lambda_n \phi_n(k') \varphi_n^*(k'')$$

where $\lambda_n$ (n=1, ..., N) denotes the N largest eigenvalues and $\phi_n(\bullet)$ and $\phi_n^*(\bullet)$ denote the corresponding left and right eigenvector of the matrix, respectively. It is noted that (Eq. 6) is exact when all terms are retained in the SVD expansion, i.e., when N is equal to the rank of the AFGK matrix. However, in actual applications, it is typical to truncate the series by selecting a smaller N to increase the speed of the computation process.

Then, rewriting (Eq. 6) in frequency domain yields:

$$V(x) = \int_{\xi_1} \int_{\xi_2} R(x-\xi_2) M^K(x-\xi_1) \left[ \int_{k'} \int_{k''} AFGK(k', k'') \exp(i(k'\xi_1 - k''\xi_2)) dk'dk'' \right] d\xi_1 d\xi_2 =$$

$$\int_{k'} \int_{k''} AFGK(k', k'') \left[ \int_{\xi_2} R(x-\xi_2) \exp(-ik''\xi_2) d\xi_2 \int_{\xi_1} M^K(x-\xi_1) \exp(ik'\xi_1) d\xi_1 \right] dk'dk'' =$$

$$\int_{k'} \int_{k''} AFGK(k', k'') \mathcal{R}(-k'') \mathcal{M}^K(k') \exp(i(k'-k'')x) dk'dk'' = \sum_{n=1}^{N} \lambda_n \Phi_n(x) \Gamma_n^*(x)$$

Where:

$\mathcal{R}(k)$ and $\mathcal{M}^K(k)$ are the Fourier transforms of R(x) and $M^K(x)$, respectively;

$\Phi_n(x) = \int \phi_n(k) \mathcal{M}^K(k) \exp(jkx) dk$ and $\Gamma_n(x) = \int \phi_n(k) \mathcal{R}(k) \exp(jkx) dk$.

Note that one can first apply an OPC to the main feature, and then use this formula to generate AFGM, extract the assisting feature from AFGM, and apply another round of OPC to fix the print contour around the pre OPC edge locations.

To speed up the process, it is possible to skip the first OPC round and let $M^K(x)=M^T(x)$ in the calculation of AFGM, in other words ignore the $M^C(x)$ term in $M^K(x)=M^T(x)+M^C(x)$, since $M^C(x)$ is typically smaller compared to $M^T(x)$.

After the AFGM (either single kernel or multi kernel AFGM) is computed, the assisting feature is extracted from this gray level map. Without any applicable constraints, one can simply place assisting features on every pixel with positive AFGM values. However, in reality, it may not be desirable to do so, since it may affect the manufacturability of the mask. For example, current technology does not allow very small assisting features.

For 1-Dimensional (1D) gauge design, there are three relevant Mask Rule Check (MRC) constraints that should be considered in placing assisting features according to embodiments of the invention: (1) there should be a minimum assisting feature width ($W_{min}$), i.e., for any assisting feature, its width should be no less than ($W_{min}$); (2) there should be a minimum spacing between assisting feature and main feature ($S_{main}$), i.e., the gap between any assisting feature and the main feature should be no less than ($S_{main}$); and (3) there should be a minimum spacing between any two neighboring assisting features ($S_{AF}$), i.e., for any two assisting features, the gap between them should be no less than ($S_{AF}$).

Next, there will be described a method of how to place assisting features to maximize the total AFGM value (thus maximize the CD sensitivity) under these MRC constraints according to embodiments of the invention. In some respects this method is similar to the SRAF rule generation based on SGM in U.S. patent application Ser. No. 11/757,805.

Figure 5:
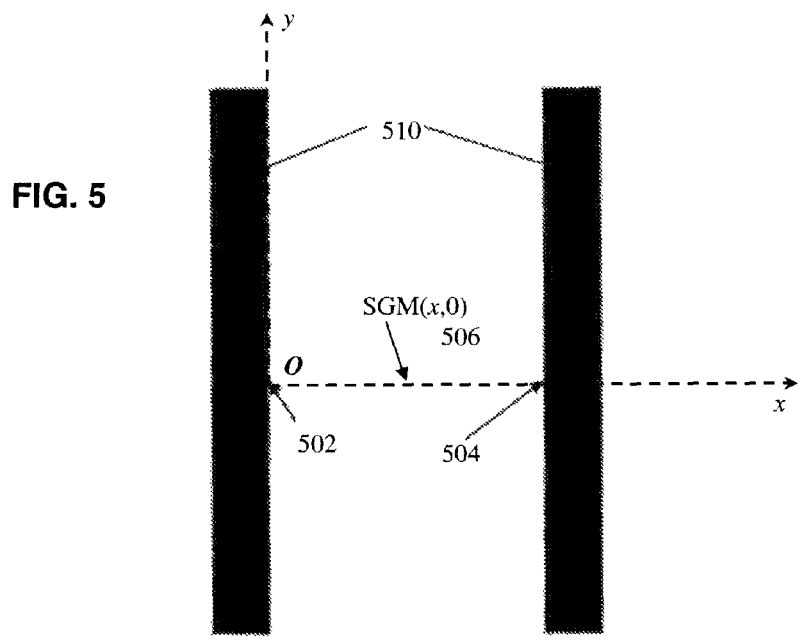
FIG. 5 is a diagram showing the coordinate system for generating assisting features according to embodiments of the invention.

FIG. 5 is a diagram showing the coordinate system for generating assisting features using embodiments of AFGM according to the invention. Here both the main features 510 and assisting features (not shown) are assumed to have infinite length as compared to their width, i.e., they are all 1D patterns. The space between any two neighboring main features 510 is the specified space value between main features, which equals the difference between the pitch and main feature 510 line width. An AFGM is then generated for the main feature 510, with or without OPC.

As shown in this figure, a coordinate system is imposed on the main features 510, where the y-axis coincides with the boundary of an arbitrary main feature and the x-axis is perpendicular to the main feature 510. In the figure, at 502 x=0 and at 504 x=space. These points correspond to the boundaries of neighboring main features 510. For such one-dimensional patterns, the AFGM is also one dimensional. Thus only the AFGM value between any two neighboring main features 510 will be investigated, denoted as S(x)=AFGM (x,0), where x=[0, 1, ... space], such as arbitrary point 506. The assisting feature extraction problem for these 1D features is then transformed into the problem of partitioning the interval [0, space] into n smaller intervals $[x_{1s}, x_{1e}]$, $[x_{2s}, x_{2e}]$, ... $[x_{ns}, x_{ne}]$, where $0 \leq x_{1s} < x_{1e} < x_{2s} < ... < x_{ns} < x_{ne} \leq$ space. Each interval represents an assisting feature, i.e., the i-th AF ($1 \leq i \leq n$) can be described as $x_{is} \leq x \leq x_{ie}$.

Determining the optimal assisting feature placement is equivalent to maximizing the total AFGM value covered by all assisting features subject to MRC rules and possibly assisting feature printability constraints. Let $S_i$ be the AFGM value covered by the i-th assisting feature ($1 \leq i \leq n$), then the total AFGM value covered by all assisting features is $$\sum_{i=1}^{n} S_i = \sum_{i=1}^{n} \sum_{x=x_{is}}^{x_{ie}} S(x)$$

There are five constraints on placing AFs in a layout: (1) minimum assisting feature width ($W_{min}$), i.e., for any i=(1, 2, .... n), $x_{ie}-x_{is} \geq W_{min}$; (2) maximum assisting feature width ($W_{max}$), i.e., for any i=(1, 2, .... n), $x_{ie}-x_{is} \leq W_{max}$; (For certain applications, there may be a finite constraint on the largest possible assisting feature width, for example, the assisting features should not print. If there is no such constraint, $W_{max}$ can be considered equal to $\infty$; (3) minimum spacing between any assisting feature and any main feature ($S_{main}$), i.e., $x_{ls} \geq S_{main}$ and $x_{ne} \leq space-S_{main}$; (4) minimum spacing between any two neighboring assisting features ($S_{AF}$), i.e., for any i=(1, 2, . . . . n), $x_{is}-x_{(i-1)e} \geq S_{AF}$; and (5) For any i=(1, 2, . . . . , n), $S_i \geq 0$. (There is no need to place assisting features with negative AFGM value, even if its value is the largest possible).

Assuming the global optimal solution (partition) for [0,space] with constraints ($W_{min}$, $W_{max}$, $S_{main}$, $S_{AF}$) is $Rule_{opt}=\{[x_{1s}, x_{1e}], [x_{2s}, x_{2e}], \ldots . [x_{ns}, x_{ne}]\}$, then the i-th assisting feature ($1 \leq i \leq n$) covers $[x_{is}, x_{ie}]$. What is more, for any i=(2, . . . , n), $\{[x_{1s}, x_{1e}], [x_{2s}, x_{2e}], \ldots, [x_{(i-1)s}, x_{(i-1)e}]\}$ is also the optimal partition for [0, $x_{is}-S_{AF}$] with the same constraints (otherwise, if there exists a better partition for [0, $x_{is}-S_{AF}$], then it can be combined with the i, i+1, . . . , n-th assisting feature placement in $Rule_{opt}$ and land at a rule that is better than $Rule_{opt}$ and still satisfies the constraints, which contradicts the optimality of $Rule_{opt}$).

Thus, the interval [0,space] is divided into smaller intervals and an algorithm is constructed based on dynamic programming. The summary of this algorithm follows, assuming space$\geq 2S_{main}+W_{min}$:

---

INPUT: space, S(x) for x=[0,1,...,space], and constraints ($W_{min}$, $W_{max}$, $S_{main}$, $S_{AF}$)
INTERMEDIATE RESULTS:
NumAFArray[x] (x=[0,1,...,space-$S_{main}$]): an array which has a size of space-$S_{main}$+1 and NumAFArray[x] stores the number of assisting features of the optimal partition for [0,x]
AFAFGMArray[x] (x=[0,1,..., space-$S_{main}$]): an array which has a size of space-$S_{main}$+1 and AFAFGMArray[x] stores the total AFGM covered by assisting features of the optimal partition for [0,x]
AFLeftEndArray[x] (x=[0,1,..., space-$S_{main}$]): an array which has a size of space-$S_{main}$+1 and AFLeftEndArray[x] stores the coordinate of the right most assisting feature's left end of the optimal partition for [0,x] (corresponds to the largest $x_{is}$ such that $x_{ie} < x$)
AFRightEndArray[x] (x=[0,1,..., space-$S_{main}$]): an array which has a size of space-$S_{main}$+1 and AFRightEndArray[x] stores the coordinate of the right most assisting feature's right end of the optimal partition for [0,x] (corresponds to the largest $x_{ie}$ such that $x_{ie} < x$)
INITIALIZATION:
Set NumAFArray[x] and AFAFGMArray[x] to zero for all x=[0,1,..., space-$S_{main}$]
AF COMPUTATION:
For i=$S_{main}+W_{min}$ to space-$S_{main}$, STEP=1 //For Constraint 3
    tempAFGMValue←AFAFGMArray[i-1]
    tempNumAF←NumAFArray[i-1]
    tempAFLeftEnd←AFLeftEndArray[i-1]
    tempAFRightEnd←AFRightEndArray[i-1]

tempNewAFAFGM← $\sum_{k=i-W_{min}}^{i}$ S(k)  // Candidate AF's AFGM value for j=i-$W_{min}$ to max$\{i-W_{max}, S_{main}\}$: STEP=-1
    //j: Candidate AF's left end.
    //The width of each AF is guaranteed to fall in [$W_{min},W_{max}$]
        if(tempNewAFAFGM$\geq$0) //For Constraint 5
            h←j-$S_{AF}$
            if(h$\geq S_{main}+W_{min}$)
                PreviousAFGMValue←AFAFGMArray[h]
                PreviousNumAF← NumAFArray[h]
                //Optimal partition for [0, j-$S_{AF}$]
            else
                PreviousAFGMValue←0
                PreviousNumAF← 0
            End
        if(tempNewAFAFGM+PreviousAFGMValue>tempAFGMValue)
            tempAFGMValue←
            tempNewAFAFGM+PreviousAFGMValue
            tempNumAF← PreviousNumAF+1
            tempAFLeftEnd←j
            tempAFRightEnd←i
        End
    End
    tempNewAFAFGM← tempNewAFAFGM+S(j-1)
End
AFAFGMArray[i] ←tempAFGMValue
NumAFArray[i] ← tempNumAF
AFLeftEndArray[i] ← tempAFLeftEnd
AFRightEndArray[i] ← tempAFRightEnd //Update all
                          intermediate results
End
OUTPUT: NumAFArray[space-$S_{AF}$], AFLeftEndArray[x] (x=[0,1,..., space-$S_{AF}$]), and AFRightEndArray[x] (x=[0,1,..., space-$S_{AF}$])

---

Figure 6:
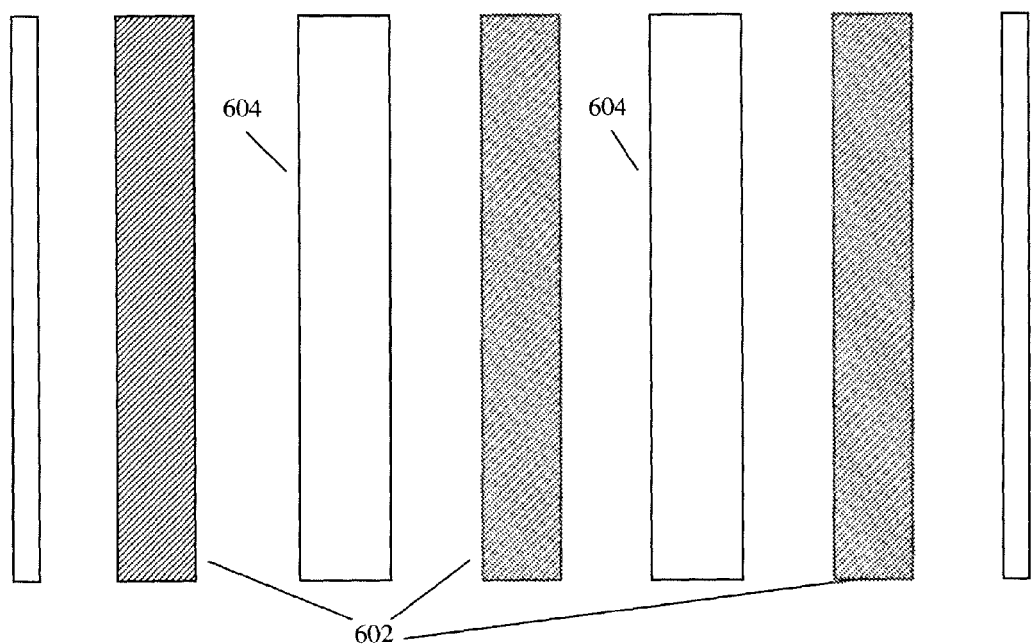
FIG. 6 is a diagram showing an example of the assisting feature placement according to embodiments of the invention.

FIG. 6 shows an example of the 1D maximum sensitive gauges generated according to embodiments of the invention, where the patterns 602 are the periodic main features and the patterns 604 are assisting features placed based on AFGM. It should be noted that there can be, and preferably are, many more main features 602 than shown in FIG. 6.

Figure 7:
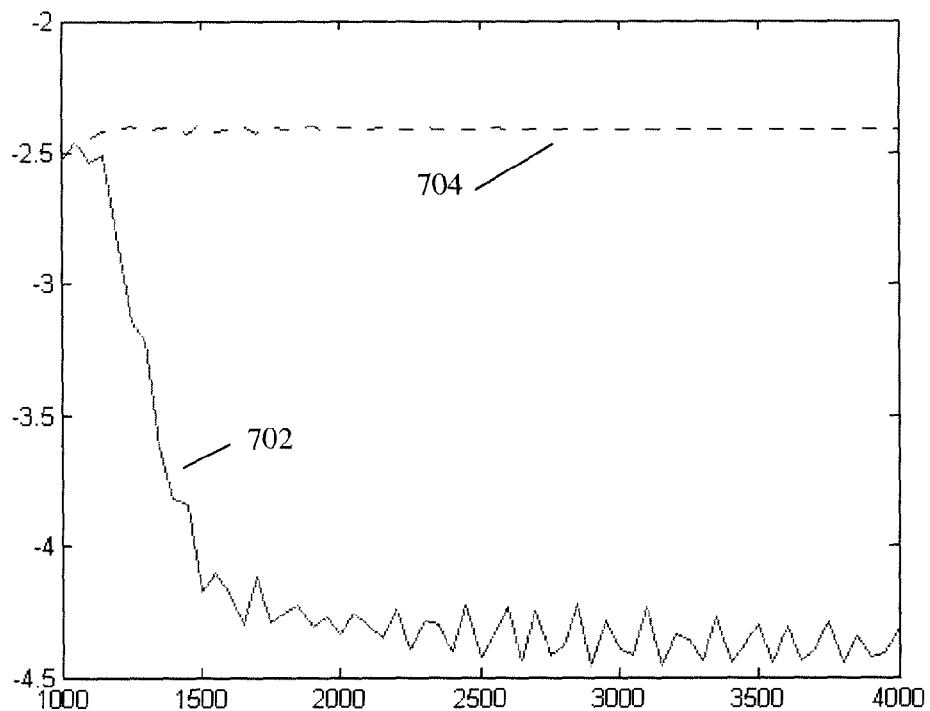
FIG. 7 is an exemplary diagram comparing between the CD sensitivities of line space patterns without any assisting features and those with assisting features according to embodiments of the invention.

FIG. 7 compares the CD sensitivities of line space patterns without any assisting feature 702 (in solid line) vs. those of the line space patterns with assisting features 704 (in dashed line) with respect to sigma variation. All of the main features' line width is 80 nm, while the x-axis shows the pitch in nm. The y-axis shows the AI CD variation in nm when sigma changes from 0.8 to 0.83. The assisting features improve the CD sensitivities significantly. Further, for small pitch, because of MRC, thus limited space for assisting feature placement, the CD sensitivities of the pure line space patterns are almost the same as those from gauges with assisting features. As pitch becomes considerably large (>1500 nm), then the CD sensitivities of the maximum sensitive gauges stabilize around the maximum value, which is consistent with the previous statement: it is preferable to choose a large pitch for the main feature.

The above describes how to identify the most sensitive main feature line width and how to use assisting features to strengthen the CD sensitivities from the main features, so that the resulting gauge has the most (absolute) CD sensitivity. The present inventors have noted that these methodologies are quite versatile in that, with a little change of sign, they can be used to design gauges for different purpose, such as gauges with maximum positive CD sensitivity, gauges with maximum negative CD sensitivity, and gauges with minimum CD sensitivity (i.e., most insensitive gauges).

Figure 8:
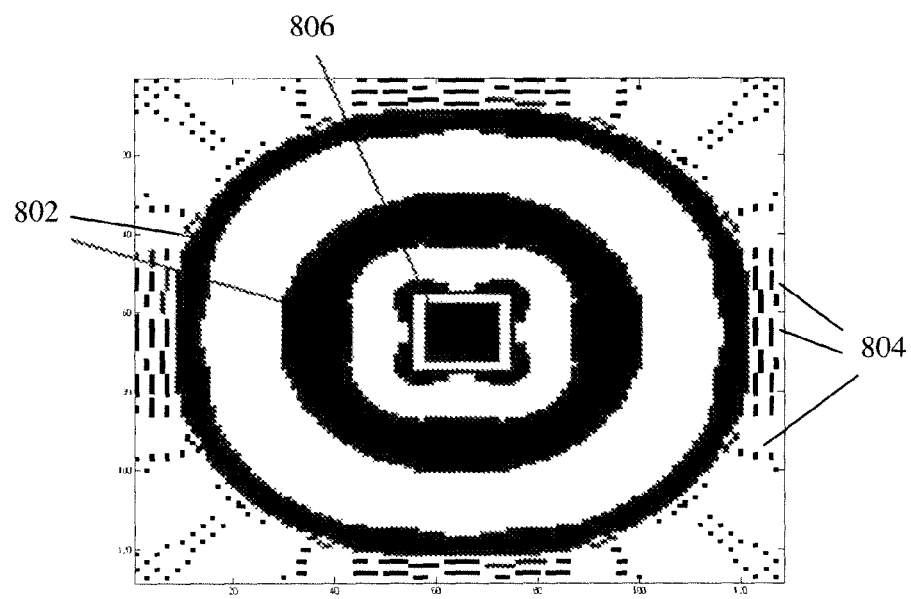
FIG. 8 is an exemplary diagram of 2D assisting feature placement according to embodiments of the invention.

Even though the above primarily discusses the design of 1D gauges, the AFGM can be computed for 2D main feature, such as contact, in the same way. Then it is possible to extract 2D assisting features from the 2D AFGM, subject to possible MRC constraints. For example, FIG. 8 shows an image with a contact 806 as the main feature and assisting features (black rings 802 and dots 804 in the surrounding area). The assisting features are designed to enhance the sensitivity (Contact's CD or energy) against Sigma variation. Those skilled in the art will recognize how to extend the 1D gauge design methodologies of the invention to designing 2D gauges based on the examples provided above.

It should be noted that these maximum sensitive gauge masks themselves can have all possible patterns designed using methodologies described above, covering a range of most possible optical setups and most possible parameter variations. However, for each specific lithography process, the actual SEM measurements do not need to be taken on all of them. The patterns that need to have SEM data taken can be analyzed after nominal parameters are known, e.g., NA, Sigma, film stack. Then the overall calibration flow can be as follows: print the Gauge Mask, determine the rough number of SEM measurements to be taken, then use a "maximum-sensitive-gauge-selection" algorithm to analyze the nominal model and select the set of gauge patterns to be measured by SEM, then take SEM measurements. The algorithm in this "selection" process can be based on methodologies described above. These selected patterns will represent the optimal set of SEM measurements.

In another embodiment, gauges are designed with different main feature line widths. This approach is called Spatial-Difference-Delta-TCC (SDDTCC) design. In this design approach, the method places two main features in each gauge and use the difference between the two CDs to calibrate the parameters. An advantage of this design is that it eliminates any measurement error in bias as long as these two main features are reasonably close. The two main feature line widths (denoted as LW1 and LW2) and the center-to-center distance between the main features (denoted as s) suffice to describe the main features. Again, for each parameter to be calibrated and each combination of (LW1, LW2, s), assisting features are added to improve the sensitivity of the delta CD (difference between the CDs of the two main features). Then the process loops over all possible (LW1, LW2, s) to identify the optimal combination. Further, one can apply the same approximations used in the previous embodiment to speed up the design. In particular, the larger the value of s, the better effect from assisting features. This is due to larger space to accommodate more assisting features and the main feature can also be viewed as assisting feature of each other. In this case, since s is quite large compared to LW1 and LW2, one can break down the SDDTCC design into two independent maximum sensitive gauge designs: the left half of the SDDTCC gauge is actually a gauge with maximum positive CD sensitivity; while the right half of the SDDTCC gauge is a gauge with maximum negative CD sensitivity.

It should be further noted that in some applications where intensity is known, e.g., certain mask model calibration, one can design intensity based gauges which maximize the intensity sensitivity against parameter variation. Here, the parameter variation can still be represented by Delta TCC. Similar to CD based calibration, increasing the intensity sensitivity also leads to better robustness against measurement error or less measurements. It is advantageous to design a mask which maximizes the intensity sensitivity at certain point. Without loss of generality, assume the point of interest is the origin point, i.e, x=0 in (Eq. 3). For mask image M(x), there should also be a constraint on the intensity norm to remove the scaling effect, for simplicity, assume that the norm satisfies $$\|M(x)\| = \sum_x |M(x)|^2 \le 1.$$

As is known, the eigenvectors $\phi_n$ (k) in (Eq. 3), which are resulted from eigenseries expansion of the Hermitian Delta TCC, are orthogonormal, i.e., $$\|\phi_n(k)\| = \sum_k |\phi_n(k)|^2 = 1 \text{ for any } n$$

$$\phi_{n_1}(k) \cdot \phi_{n_2}(k) = \sum_k \phi_{n_1}(k) \phi_{n_2}^*(k) = 0 \text{ for any } n_1 \ne n_2$$

Or, in other words:

$$\sum_k \phi_{n_1}(k) \phi_{n_2}^*(k) = \delta(n_1 - n_2).$$

Then a complete orthogonal coordinate system can be built in the space domain based on the eigenvectors, and the Fourier transform of any grayscale mask image can be represented as linear combination of all the eigenvectors, i.e., $$\mathcal{M}(k) = \sum_n c_n \phi_n(k).$$

From the mask image intensity constraint and Parseval's Theorem, $$\sum_i |c_i|^2 = \|\mathcal{M}(k)\| = \|M(x)\| \le 1.$$

Without loss of generality, assume that the eigenvalues are ordered such that $$|\lambda_1| \ge |\lambda_2| \ge |\lambda_3| \ge \ldots$$

Thus, the first eigenvector $\phi_1$ (k) corresponds to the most significant eigenvalues of the Delta TCC. Then from (Eq. 3), the change (Delta I) in aerial image intensity at x=0 resulted from the mask image $\mathcal{M}$ (k) is $$\Delta I(0) = \sum_n \lambda_n \left| \sum_k \phi_n(k) \mathcal{M}^*(k) \right|^2$$

$$= \sum_n \lambda_n \left| \sum_k \phi_n(k) \sum_m c_m \phi_m^*(k) \right|^2$$

$$= \sum_n \lambda_n \left| \sum_m \sum_k c_m \phi_n(k) \phi_m^*(k) \right|^2$$

$$= \sum_n \lambda_n \left| \sum_m c_m \delta(n-m) \right|^2$$

$$= \sum_n \lambda_n |c_n|^2$$

Since there exists the constraint:

$$\sum_n |c_n|^2 \le 1$$

and the assumption that $$|\lambda_1| \ge |\lambda_2| \ge |\lambda_3| \ge \ldots,$$

then.

$$\Delta I(0) = \sum_n \lambda_n |c_n|^2 \le \sum_n |\lambda_1| |c_n|^2 = |\lambda_1| \sum_n |c_n|^2 \le |\lambda_1|.$$

Similarly, $$\Delta I(0) \geq -|\lambda_1|.$$

Therefore, if a mask is designed which is the inverse Fourier transform of delta TCC's most significant kernel $\phi_1(k)$, i.e., $c_n = \delta(n-1)$, then it has the maximum (absolute) aerial image intensity sensitivity. Such mask pattern "resonates" with delta TCC.

Multivariate Calibration Pattern Design

The above describes methods to design gauges that are extremely sensitive (in CD, CD difference, or aerial image intensity, for example) to one specific optical parameter, which can be considered as a specific direction in the model parametric space.

In the above methodology, the process uses TCC's to compute the predicted CD and perform gauge design, and the parameter perturbations are expressed in Delta TCC's. So for each given parameter P, the methodology forms Delta TCC's by changing the single parameter P to P+ΔP while keeping the other parameters constant.

However, as mentioned earlier, for some parameters, the present inventors recognize that gauges designed using the methodologies above may exhibit quite similar behavior for several different parameter variations; therefore, it is extremely difficult to distinguish these parameters' variations using such a gauge set, and so the gauge set may be incomplete in calibrating these parameters separately (i.e. degeneracy among parameters). Using one simple example, suppose there are two parameters $P_0$ and $P_1$ and only one gauge, and the relationship between the predicted gauge CD and parameters $P_0$ and $P_1$ is $CD = k + g(P_0 + hP_1)$, where k, g, and h are arbitrary constants independent of $P_0$ and $P_1$ that will become more apparent from below. In a typical calibration, the process is to first measure the actual wafer CD, $\tilde{CD}$.

Then the process looks for the values for all parameters including $P_0$ and $P_1$ such that they minimize the error between the predicted CD and measured wafer CD, as defined in Eq. 4 above. For this example, any values of parameters $P_0$ and $P_1$ such that $$P_0 + hP_1 = (\tilde{CD} - k)/g$$

will lead to the minimum calibration error (i.e. predicted minus measured CD equals zero) for arbitrary values of g, h and k, where g is a scaling factor between CD and parameters. In other words, there is no way to determine unique values for $P_0$ and $P_1$; thus, the model built from this calibration process may only work well for this specific gauge, but it does not capture the behavior for all possible patterns. Therefore, it becomes apparent that it is critical to design gauges which maximize differential response to different parameter variations to achieve sufficient pattern coverage.

In general, the embodiments provided below provide several different methodologies to design gauges that respond vastly differently to different parameter variations in order to achieve complete pattern coverage. The focus of the discussion below is on CD sensitivities; however, those skilled in the art will recognize that all the embodiments described herein are versatile so that they can be applied to other measurements, such as CD difference sensitivities, or aerial image intensity sensitivities. The present inventors recognize that, in order to achieve best complete pattern coverage, the gauges should maximally and distinctly excite all the physics and chemistry parameters to be calibrated, making sure that the wafer data for the gauges can drive the model calibration to the optimal parameter values.

In a first embodiment, a set of gauges is created to maximize the pair-wise differential CD sensitivity to different parameter variation(s). The resulting gauges are referred to herein as Max-Delta-Parameter-Difference gauges (MDPDG). In particular, between each pair of the parameters, the invention creates pair-wise gauges that maximize the CD sensitivity with respect to the delta-parameter-difference. If there are N parameters, there are $C_N^2 = N(N+1)/2$ pairs or N(N+1) gauges. For each pair, this embodiment specifies that there are at least two gauges, represented as $(\Delta P_1, -\Delta P_2)$ and $(\Delta P_1, \Delta P_2)$, where $\Delta P_1$ and $\Delta P_2$ denote the perturbed amounts for parameters $P_1$ and $P_2$, respectively. More specifically, for $(\Delta P_1, -\Delta P_2)$, this embodiment of the invention designs the gauge that maximizes the CD sensitivity when parameter $P_1$ changes from its nominal value $P_{10}$ to $P_{10} + \Delta P_1$ and $P_2$ changes from its nominal value $P_{20}$ to $P_{20} - \Delta P_2$, simultaneously.

In this embodiment, the gauge design method is preferably the same as that for gauges maximizing the CD sensitivity with respect to a single parameter as taught in the univariate calibration pattern design section. More particularly, the design of a gauge maximizing the CD sensitivity with respect to $P_1$ change as performed in the embodiments above relating to univariate calibration pattern design can be viewed as the design of MDPDG of $(\Delta P_1, 0))$ according to the present embodiment $(\Delta P_1 = P_1 + \Delta P$, where $\Delta P$ is a small perturbation amount). The present embodiment extends the approach of the above embodiments to find a pair of MDPDG gauges $(\Delta P_1, \Delta P_2)$ and $(\Delta P_1, -\Delta P_2)$ that both maximize the CD sensitivity when parameter $P_1$ changes from its nominal value $P_{10}$ to $P_{10} \pm \Delta P_1$ and $P_2$ changes from its nominal value $P_{20}$ to $P_{20} \pm \Delta P_2$, simultaneously and respectively ($\Delta P_1$ and $\Delta P_2$ are small perturbation amounts, and may or may not be equal to each other).

For example, rather than designing a single gauge per parameter using a Delta TCC that captures only one parameter perturbation as in the embodiments above, the present embodiment designs a pair of gauges for each pair of parameters. The present embodiment therefore uses a respective pair of Delta TCCs that both capture two parameter perturbations as set forth above, namely one Delta TCC based on $(\Delta P_1, \Delta P_2)$ and one Delta TCC based on $(\Delta P_1, -\Delta P_2)$. These Delta TCCs are then used in the design gauge methodologies described in the above embodiments in place of the single-parameter Delta TCCs described therein.

This methodology directly maximizes the differential behavior to different parameter variations. Thus, unlike the gauges designed to maximize single parameters, MDPDGs should guarantee complete pattern coverage, given a sufficient number of gauges.

If the number of parameters to be calibrated is small, then the number of required MDPDGs is not large. For example, if there are N=5 optical parameters, the above method will require the design of N*(N-1)=20 gauges, which is easy to handle. However, if the number of parameters increases, the number of resulting gauges increases very fast and will be on the order of $O(N^2)$. In that case, in an embodiment manual intervention or artificial intelligence algorithms (e.g., Supporting Vector Machines) are used to separate the parameters into multiple less-correlated groups. Then, where inter-group degeneracy is weak, pair-wise MDPDGs are designed within each group.

Using the MDPDG design according to this embodiment for multivariate calibration pattern design the minimum required number of gauges is reduced to N*(N-1) gauges. In most practical situations this is already much better than "full-chip" pattern sets or other pattern sets that are representative of the pattern variety in the product. Additionally the method is independent of the variety in the actual products which are produced after a lithographic process is initiated based on the calibrated model. Theoretically speaking, assuming that there exists good linearity between CD sensitivity and parameter variation and no degeneracy in the transformation from model parametric space to CD-sensitivity space (this assumption is generally true from simulations and experiments. Also note that the degeneracy here is not the degeneracy from model parametric space to a very limited gauge set discussed previously, but the transformation from model parametric space to CD-sensitivity space, or all possible gauges patterns), and that wafer measurement error can be ignored, then there should exist N gauges that cover the N parameter variations sufficiently. However, MDPDG design requires at least N*(N−1) gauges, which suggests certain redundancy in the gauge design, and further in the amount of measurements required.

Multivariate Orthogonal Calibration Pattern Design

Additional embodiments will now be described according to a methodology to design gauges with sufficient pattern coverage. The number of resulting gauges in this approach is in the order of O(N). When there are only an order of O(N) gauges needed, less computation run time is required. Also, fewer gauges have to be measured physically, which reduces metrology costs and time constraints.

The inventors have noted that some parameters have strong degeneracy due to their close physical relationship, such as parameters related to focus and aerial image location. So many patterns exhibit very similar response to changes in these two parameters. Further, CD sensitivities for all parameters are typically correlated with aerial image intensity and/or resist image intensity slope at the contour, while the design goal of dose-sensitive gauges is to decrease the aerial image/resist image intensity slope at the contour. So dose-sensitive gauges are not only sensitive to dose variation, they are also quite sensitive to many other parameters and thus selected as gauges specific for these parameters. Therefore, it is extremely difficult to differentiate the behavior of one parameter from the other, and thus it is difficult to determine the precise values for these parameters in calibration. As a result, it would be advantageous to break such degeneracy in gauges' response to different parameter variations.

Accordingly, in the following design embodiments, one aspect is to determine N orthogonal directions in the N-dimensional model parametric space. Such gauges are thus referred to herein as orthogonal gauges. The first such embodiment depends on a large set of test calibration patterns representative of all aspects of product patterns which are to be produced based on the calibrated model. The second such embodiment is based on the change in TCC's (Delta TCC). Note that TCC's can be computed without knowledge of the pattern to be imaged. Hence, this leads to independence of the second embodiment from the requirement to follow a large set of test calibration patterns.

Before describing the details of gauge design according to this embodiment, a brief review of techniques in pattern coverage measurement is provided, which can help in understanding the present invention gauge design procedure. Pattern coverage can be measured by a certain cost function, for example the cost function described in, for example paragraph [0051] of U.S. Patent App. No. 61/140,812 (P-3365), commonly owned by the present assignee and incorporated herein by reference in its entirety, where the pattern coverage of a gauge set is measured by the remaining CD prediction uncertainty after applying this gauge set in calibration. In this embodiment, the invention preferably uses the same cost function definition in the gauge set design. The details of this cost function as well as those of the gauge design, to the extent helpful to teach those skilled in the art about the principles of this embodiment of the present invention, are described in more detail below.

Assuming there are a total number of G (G>>N) patterns, denote the sensitivity of the g-th gauge (g=1, . . . , G) to the model parameter $P_n$ (n=1 . . . N) by $$K_{ng} = \frac{\partial CD_g(P_n)}{\partial P_n}\bigg|_{P_n=P_{n0}},$$

where $P_{n0}$ is the nominal value for parameter $P_n$. Imagine a plot in the N-dimensional sensitivity space in which each point is a prospective test pattern, with coordinate $K_{ng}$ for the g-th point on the n-th axis. Each axis corresponds to one parameter, and each point corresponds to the sensitivity of a particular pattern with respect to all N parameter changes. Similar to the approach for pattern selection in U.S. Patent App. No. 61/140,812 (P-3365), this gauge design can also be described as a maximization of an enclosed volume of designed gauges in sensitivity space. For a given target number L of gauges, this approach attempts to design the L patterns that results in the maximum enclosed volume in the sensitivity space. This approach prevents degeneracy because degeneracy will lead to small enclosed volumes. Below, the concrete procedures to find the patterns that achieve this maximization are explained.

A next step in this approach is to perform Principal Component Analysis (PCA, also known as Karhunen-Loève Transform (KLT), Hotelling Transform, or proper orthogonal decomposition (POD)) on the sensitivity matrix $K_{ng}$. In this mathematically rigorous approach, the principal components of the sensitivity matrix are identified. These are the directions in the N-dimensional model parametric space that capture the most variations in the sensitivities, and as a result of the PCA, these directions are orthogonal (perpendicular) to each other. This way, the maximum sensitivity requirement and the least degeneracy requirement can be satisfied at the same time.

An outline of part of this embodiment is as follows, whereas further details will be provided below. A next step in this approach is to find a Confidence region of model parameters. Then a cost function related to the confidence region is designed as the optimization target. One cost function that can be used is the trace of the inverse of the covariance matrix in the normal equation for the least-squares optimization (see descriptions below for the mathematical formulation). The present inventors recognize that minimization of this confidence region is equivalent to maximization of enclosed volume in sensitivity space. But some refinement will be needed to handle the interaction between the model parameters, since they have different units, and it is generally undesirable that the choice of units should result in some parameters being favored over the others in the gauge design.

After designing the cost function, a next step in this approach is to find a Confidence region of predictions of test pattern CD's. In order to deal with the problem of handling model parameters with different units, the algorithm calculates the model parameter uncertainties and simulates their impact on CD prediction uncertainty. The problem can be stated as follows: Design the set of L gauges that minimizes the sum-of-squared-errors uncertainty in the CD prediction for a target set of test patterns—which can be the set of the G training patterns themselves or another pattern set from an actual product layout—as estimated from the confidence region of the model parameters.

Certain aspects of a Mathematical Formulation of cost functions based on the confidence regions mentioned above according to an embodiment of the invention for designing gauges for lithographic model calibration will now be described in more detail.

The index p is further used to correspond to the actual physics and chemistry in the lithographical process, while m is used to correspond to nominal values of the parameters in the model description of the process. Furthermore, let $P_p$ and $P_m$ represent the physical parameter values and the nominal model parameter values, and use a common parameter index j to signify the conceptual correspondence between actual parameter values $P_{pj}$ and nominal model parameter values $P_{mj}$.

Let CD denote the values for candidate test patterns from which the pattern coverage of the designed gauges for the actual model calibration is to be evaluated. More particularly, let $CD_p$ denote the set of measurement values for these patterns and $CD_m$ the set of nominal model predicted values for the same patterns. The task of model calibration will then be the determination of $P_{pj}$, given $P_{mj}$, $CD_p$, and $CD_m$ as input.

In the context of model calibration (in fact, for many other applications, such as scanner matching, this approximation is still valid), an assumption can be made that the variations of physical and model parameters are within a small range during calibration. Accordingly, it can be assumed that a linear formulation is appropriate for the small value difference under consideration. Therefore, the simulated pattern sensitivity for a given pattern i to a parameter j can be described as $$K_{m,n,g} = \frac{\partial CD_{m,g}}{\partial P_{m,n}}$$

The pattern coverage measurement thus the gauge design will be based on this sensitivity matrix $K_m$. Assume that for the purpose of gauge design, the sensitivity matrix calculated from a reasonably accurate nominal model description (m) will be sufficient. as the reasonably accurate nominal model description brings the sensitivities in the linear range.

Starting from the linearized model calibration equation $$CD_{p,g} - CD_{m,g} = \sum_n K_{m,n,g}(P_{p,n} - P_{m,n}),$$

This is usually an over-determined equation (i.e. the number of gauges is larger than the number of parameters) such that actual parameters $P_{pj}$ can be fitted in the least-squares sense. Considering the fact that wafer measurements $CD_{p,i}$ have inherent uncertainties (denoted $\sigma_g$), the equation may be rewritten in the matrix form Ax=b and solved using the normal equation formulation $(A^TA)x=A^Tb$ where $$A_{ng}=K_{m,n,g}/\sigma_g,\ x_n=P_{p,n}-P_{m,n},\ b_g=(CD_{p,g}-CD_{m,g})/\sigma_g$$

Matrix $C=(A^TA)^{-1}$ is closely related to the probable or standard uncertainties of the estimated parameters x, in that it is the covariance matrix of x (see, e.g., a book titled "Numerical Recipes in C: The Art of Scientific Computing", by W. H. Press, Cambridge, U.K.: Cambridge Univ. Press, (1992)):

$$\sigma^2(x_j)=C_{jj},\ Cov(x_j,x_k)=C_{jk}$$

A confidence region for the parameters can be derived from the covariance matrix, for example as described in the book entitled "Numerical Recipes in C, The Art of Scientific Computing," 2d ed., W. H. Press, S. A. Teukolsky et al., Chap. 15, Cambrige University Press, 1992. If it is chosen to minimize the 'size' of this confidence region (defined as the sum of squared principal axis dimensions of the confidence ellipsoid, or the sum of squared uncertainty level of individual parameters) at a certain confidence level, this cost function will in fact be equal to the trace of matrix C.

The cost function definition above contains an undesirable arbitrariness due to the artificial choice of parameter units. One alternative to avoid this is to project the estimated covariance matrix of the parameters to CD prediction errors over a large pattern space, and use the sum of squared error for all the pattern CD predictions as the cost function. In practice, a full-chip pattern set or a pre-determined set of representative patterns (i.e. a training pattern set) may be used that can emulate the full-chip pattern behavior. The point is that the pattern set (or set of patterns) should cover all possibly desired calibration patterns (and a pattern corresponding to nominal parameter values). If the 'full-chip' pattern set has the full sensitivity matrix of A, this updated cost function will take the form of $$\sum_{CD \in full-chip\ pattern\ set} \sigma^2(CD) = Tr[ACA^T] = Tr[A(A^TA)^{-1}A^T]$$

and the minimization of this function will be used to drive gauge design in a final implementation.

To achieve the minimization of the cost function described above, embodiments of the invention perform principal component analysis on the full sensitivity matrix A, and design gauges that maximize the CD sensitivity for the directions in the N-dimension sensitivity space along which most variations in A are distributed. The resulting gauges whose sensitivities are most aligned with these principal directions will be the most efficient ones in reducing the cost function.

Having provided the above details regarding the cost function to be used, a calibration gauge design methodology according to this embodiment of the invention will now be further described in connection with the flowchart provided in FIG. 9.

In an embodiment (FIG. 9), initial estimates of N model parameters are created (S902) by using, for example, any combination of machine setting data, on-tool metrology data and tool design data. As described above, let p describe the actual physics and chemistry in the lithographical process, while m is a nominal model description of the process. As further mentioned above, let $P_p$ and $P_m$ represent the physical parameters and the nominal model parameters, respectively, and use a common parameter index n to signify the conceptual correspondence between actual parameters $P_{pn}$ and nominal model parameters $P_{mn}$.

In step S904, a large collection of patterns (e.g., 'full-chip' pattern set) that is representative of the pattern variety in the product on which the model is to be used is determined. For example, users can pool all the patterns that appear in a desired chip design into this collection.

In step S906, based on the initial model estimate, the sensitivities, $K_{ng}$, for all patterns g to each of the model parameters n=1, ..., N that will be calibrated during the calibration process are calculated using the equation for $K_{ng}$ set forth earlier in this application, wherein the predicted CD's in that equation are calculated using aerial image simulation techniques well known to those skilled in the art, and Delta TCCs corresponding to each parameter. In one example, each test pattern (g=1 ... G, where G is the total number of test patterns) corresponds to a point, or equivalently, a vector, in the N-dimensional sensitivity space (as there are N model parameters). All these points can be viewed as cumulatively forming a sensitivity "cloud" for the full-chip pattern set.

In step S908, PCA is performed on the points in the sensitivity 'cloud' for the full-chip pattern set, using the matrix $A=K/\sigma$ More particularly, the contribution to sensitivity variation from each of the principal components is calculated. The PCA of A can be determined using the eigen-decomposition of matrix $A^TA$, which yields the diagonal eigenvalues matrix D and the principal direction vectors (eigenvectors) V, i.e., $$A^TA = VDV^T, W^T = I$$

and the diagonal matrix is composed of the singular values, i.e., $$D = \text{diag}[\lambda_1^2, \lambda_2^2, \ldots, \lambda_N^2],$$

where $I$ is the identity matrix. Without loss of generality, it is assumed that $|\lambda_1| \geq |\lambda_2| \geq \ldots |\lambda_N|$.

In step S910, the PCA result of $A^TA$ as expressed with the eigenvalues and eigenvectors as described above is viewed as an ellipsoidal surface (ES) embedded in the N-dimensional model parametric space.

In step S912, the principal direction corresponding to the largest singular value is chosen ($\lambda_1$) and this direction is defined as $V_1$, which is a direction in the N-dimensional model parametric space. Note that the eigenvector $V_k$ can be written as $V_k = [V_{k1}, V_{k2}, \ldots, V_{kN}]^T$.

In step S914, the index k, corresponding to the directions in the model parametric space to be calibrated, is initialized with 1. Moreover, the first current working sub-space (WSS) is created as the full N-dimensional model parametric space.

In step S916, one or more gauges are designed that maximize the sensitivity to the model parametric direction $V_k$. In this step, it is assumed that the CD sensitivity $$K_{m,n,g} = \frac{\partial CD_{m,g}}{\partial P_{m,n}}$$

(i.e., the g-th pattern's CD sensitivity against the n-th model parameter's variation) is computed using a finite difference method. For example, the CD change (denoted as $\Delta CD_{m,n,g}$) of the g-th pattern when a small perturbation (denoted as $\Delta P_{m,n}$) is added to the n-th model parameter is computed. Then $K_{m,n,g}$ is computed as $$K_{m,n,g} = \frac{\Delta CD_{m,n,g}}{\Delta P_{m,n}}.$$

In order to design gauge(s) maximizing the sensitivity for direction $V_k$, first the delta TCC is computed for delta parameters ($V_{k1}\Delta P, V_{k2}\Delta P, \ldots, V_{kN}\Delta P$). More particularly, this involves calculating the element-by-element difference between the perturbed TCC matrix when the n-th model parameter is perturbed by $V_{kj}\Delta P$ for all $j=1, 2, \ldots, N$ and the nominal TCC matrix, where $\Delta P$ is a small perturbation value. For example, $\Delta P$ is set to a value such that CD sensitivity is around 10 nm. However, for small parameter variations ($\Delta P$) the relationship with CD is linear. Then the methodology described in the above univariate parameter-sensitive calibration pattern design embodiments is used to design the gauge(s) maximizing the CD sensitivity for this delta TCC instead of the univariate (single-parameter) Delta TCC as described earlier. Note that, for each direction $V_k$, a few gauges can be designed with CD sensitivities slightly smaller than that of the most sensitive gauge. However, each of these different gauges will have a slightly different model parametric direction, which leads to more gauges and thus higher robustness against errors such as measurement errors. In the calibration pattern sets according to the embodiment there is optimal robustness against errors such as measurement errors.

In step S918, the actual sensitivity(ies) of the gauge(s) obtained in step S916, denoted as $W_k$ are computed. This is done, for example, using the same equations as above, but with the actual gauge pattern(s) designed in S916. It should be noted that this sensitivity vector typically does not align with $V_k$ perfectly.

In step S920, the current working sub-space WSS is reduced to a lower dimension by removing the sensitivity direction of $W_k$. In other words, the WSS is reduced to a subspace that is orthogonal to $W_k$.

In step S922, k is increased by 1. A new direction $V_k$ is defined, which is the longest vector in the intersection between the ellipsoidal surface ES and the current working sub-space WSS.

In step S924, steps S916 through S922 are repeated for the rest of the pattern set until the dimensionality of the parametric space is fully exhausted.

By this point, the process has achieved coverage for every parameter, i.e., no parameter will be left unconstrained in the model calibration stage. Within the metrology time limitation, it would be desirable to include more gauges to enhance the coverage, e.g., improve the robustness against wafer measurement error. The total number of gauges can be increased by increasing the number of gauges designed in each step S916, thus increasing the subsequent directions. But the minimum number of gauges is N, i.e., the number of model parameters to be calibrated, which is consistent with the (theoretical) analysis given earlier.

The aforementioned methodology achieves the goal of designing O(N) gauges with complete pattern coverage. However, it may have certain drawback for some applications. In particular, PCA, and thus the parametric directions, rely on the identification of a large training pattern set, which may be full-chip patterns or a large collection of representative patterns as mentioned above. This may be difficult in real applications: first, it may be hard to determine the truly representative training patterns. Even if a full-chip pattern set is used, it may still become unmatched if the gauges are used for the calibration of the same lithography condition for a different design layout. Second, it may be expensive to compute and process the sensitivity matrix for a large pattern set. For these reasons, it is desired to devise a methodology which purely depends on the model and does not depend on the choice of initial pattern set.

Accordingly, another embodiment of a methodology for designing calibration gauges, based on identifying parametric directions from Delta TCCs, will now be described in connection with the flowchart in FIG. 10. In general, in the previous embodiment, optimization was based on the square root of the sum of square of CD sensitivities. In this embodiment, optimization is instead based on the Hilbert-Schmidt norm of the Delta TCC matrix, i.e., the square root of the sum of square of TCC matrix elements.

Figure 10:
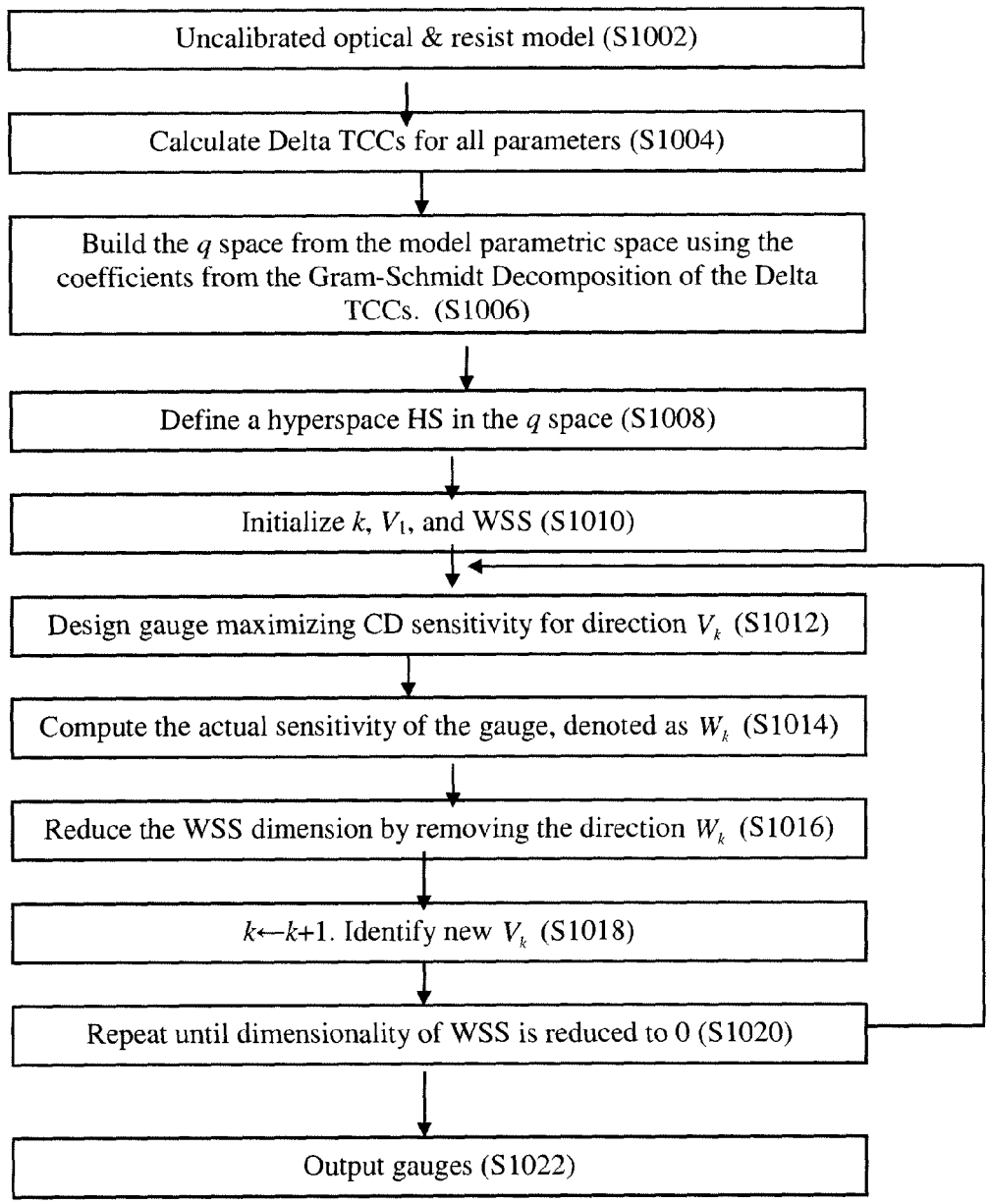
FIG. 10 is a flowchart of an exemplary method for designing orthogonal gauges based on Delta TCCs according to an embodiment of the present invention.

As in the previous embodiment, as shown in FIG. 10, in step S1002, initial estimates of N model parameters are created by using, for example, any combination of machine setting data, on-tool metrology data and tool design data. As described above, let p describe the actual physics and chemistry in the lithographical process, while m is a nominal model description of the process. As further described earlier, let $P_p$ and $P_m$ represent the physical parameters and the nominal model parameters, and use a common parameter index n to signify the conceptual correspondence between actual parameters $P_{pn}$ and and nominal model parameters $P_{mn}$.

In step S1004, this embodiment first calculates the Delta TCCs for all parameter perturbations. This is done, for example, by an element by element difference between the nominal and perturbed TCC matrices. Denote Delta $TCC_j$ as the Delta TCC resulting from a small perturbation ($\Delta P_n$) on parameter $P_n$.

Next in step S1006, each Delta TCC matrix is rearranged into a vector. Howe this is done does not affect the outcome, however, all the Delta TCC matrices should be arranged in the same order. So the number of vectors is N, i.e., the number of model parameters. The Gram-Schmidt transform is then applied to these vectors, with the inner product defined to be consistent with the Hilbert-Schmidt norm (sum of product between corresponding matrix elements of the two Delta TCCs). In particular, the inner product between two Delta TCCs: $\Delta TCC_1 = \Delta TCC_1(k_1, k_2)$ and $\Delta TCC_2 = \Delta TCC_2(k_1, k_2)$ is:

$$\langle \Delta TCC_1, \Delta TCC_2 \rangle = \sum_{k_1, k_2} \Delta TCC_1^*(k_1, k_2) \Delta TCC_2(k_1, k_2),$$

where * indicates complex conjugate.

The Hilbert-Schmidt norm of a vector can also be viewed as the square root of the inner product of the vector and itself, i.e., $\|\Delta TCC\| = \sqrt{\langle \Delta TCC, \Delta TCC \rangle}$. Further, the projection operator is defined by $$proj_{\Delta TCC_1} \Delta TCC_2 = \frac{\langle \Delta TCC_1, \Delta TCC_2 \rangle}{\langle \Delta TCC_1, \Delta TCC_1 \rangle} \Delta TCC_1.$$

In Gram-Schmidt transform, a new set of N orthogonal vectors $(Z_1, Z_2, \ldots, Z_N)$, is then generated. Each new vector has the same number of elements as Delta TCCs, thus the definitions of inner product, Hilbert-Schmidt norm, and projection operator for Delta TCCs also apply to the new vectors and Delta TCCs. Then $(Z_1, Z_2, \ldots, Z_N)$ are computed as:

$$Z_1 = \Delta TCC_1$$

$$Z_2 = \Delta TCC_2 - proj_{Z_1} \Delta TCC_2$$

$$\vdots$$

$$Z_N = \Delta TCC_N - \sum_{n=1}^{N-1} proj_{Z_n} \Delta TCC_N$$

Finally, the Gram-Schmidt transform of Delta TCCs is defined as another set of N orthogonal vectors $(Y_1, Y_2, \ldots, Y_N)$ which are the normalization of $(Z_1, Z_2, \ldots, Z_N)$, i.e., $Y_n = Z_n / \|Z_n\|$, for any n=1, 2, ..., N. Note that since each of $Z_n$ is a linear combination of Delta TCCs as a result of the orthogonalization process, each $Y_n$, which is $Z_n$ divided by its length, is also a linear combination of Delta TCCs, i.e., $$Y_n = \sum_{k=1}^{N} h_{nk} \Delta TCC_k,$$

where $h_{nk}$ are constant coefficients which only depend on Delta TCCs. Then the parametric space is transformed using exactly the same coefficients. For example, a set of orthogonalized parametric vectors $q_n$, (n=1, ..., N) is generated where $q_n = (h_{n1} \Delta P_1, h_{n2} \Delta P_2, \ldots, h_{nN} \Delta P_N)$. Each $q_n$ vector represent a direction in the N-dimensional parametric space which leads to a Delta TCC with norm 1, and all the resulting Delta TCCs are orthogonal with each other, under the assumption that all Delta TCCs are linear with respect to small parametric variations.

In step S1008, this embodiment next defines a hypersphere HS in the q space with unit radius.

In step S1010, k is initialized to 1, and the current working sub-space WSS is initialized as the full N-dimensional model parametric q space, and $V_1$ to some arbitrary vector of unit length in the q space. The choice is arbitrary, now there is a hypersphere instead of an ellipsoidal surface.

Next in step S1012, the Delta TCC corresponding to $V_k$ is computed. Similar to the embodiment described above in connection with step S916, gauge(s) are then designed for maximizing CD sensitivity for this Delta TCC, using the techniques of the above univariate parameter-sensitive gauge design embodiments. Several different gauges can be designed using this Delta TCC, further similar to the embodiment described above. Moreover, different gauges may be designed using a different $V_1$ in step S1010.

Further similar to the embodiment above with step S918, the actual sensitivity of the gauge is calculated in step S1014. In this case, the new gauge pattern must be projected onto the q space. The sensitivity vector, $W_k$, defined in the q space is then invoked. It may have components along directions other than $V_k$.

Similar to the embodiment above with step S920, in step S1016 the current working sub-space WSS is reduced to a lower dimension by removing the sensitivity direction of $W_k$. In other words, WSS is reduced to its subspace that is orthogonal to $W_k$.

In step S1018, k is increased by 1. Moreover, a new direction $V_k$ is defined, which is an arbitrary vector in the intersection between the hypersphere HS and the current working sub-space WSS (which is a hypersphere of lower dimension).

In step S1020, steps S1012 to S1018 are repeated until the dimensionality of the q space is fully exhausted.

In an embodiment wherein more gauge patterns are allowed, the above steps are wrapped in a bigger loop. In each iteration of the bigger loop, there can be a different way for choosing a vector from a hypersphere. Of course, several gauges can also be generated for each direction, and then the number of subsequent directions can be increased. Again, the minimum number of gauges is N, i.e., the number of model parameters to be calibrated, which is consistent with the theoretical analysis.

Figure 9:
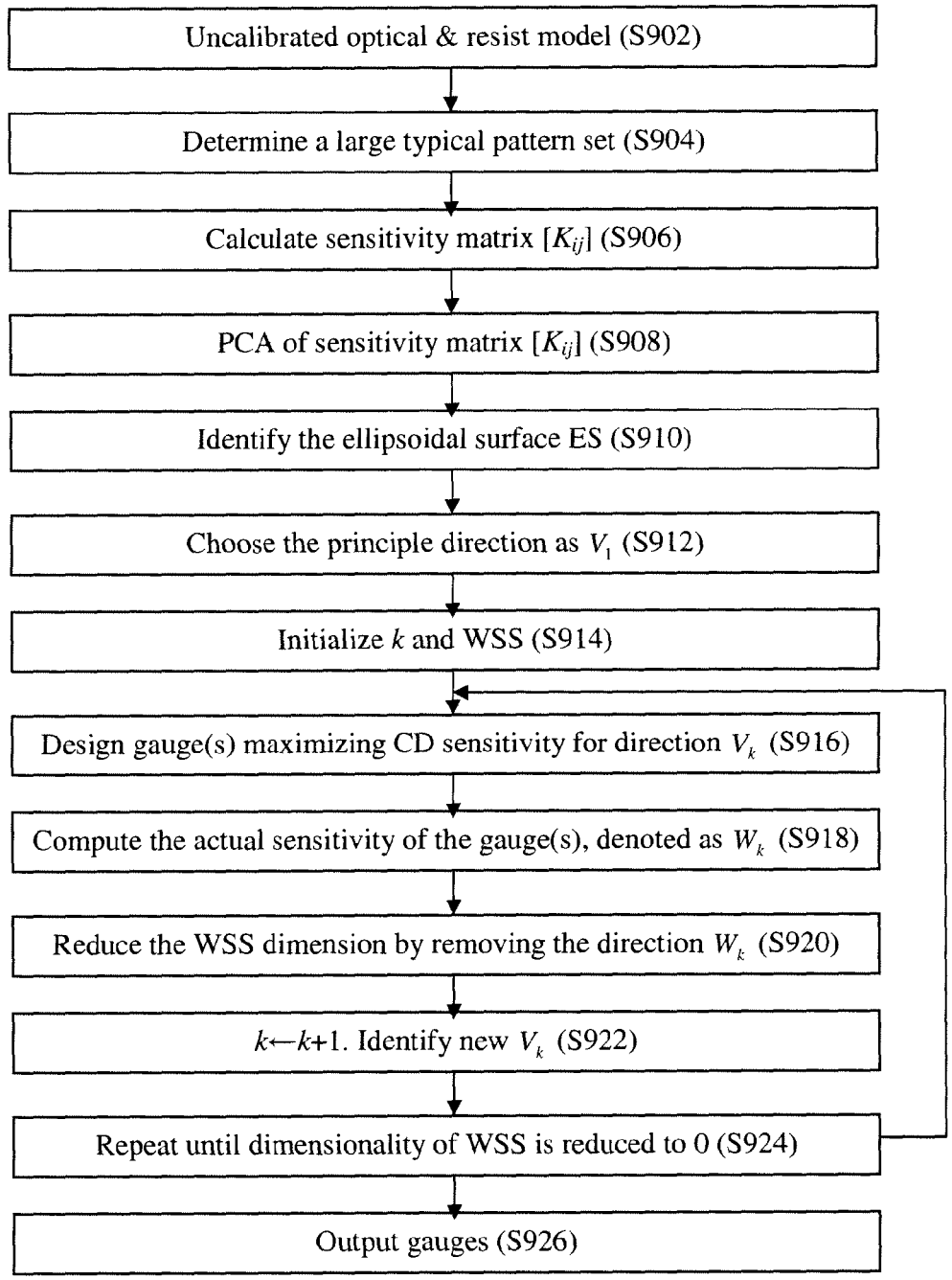
FIG. 9 is a flowchart of an exemplary method for designing orthogonal gauges based on the CD sensitivities of a large pattern set according to an embodiment of the present invention.

There are many similarities between the embodiments described in FIGS. 9 and 10. However, there are two major differences:

1. Note that the matrix g is not necessarily orthonormal. This is a major conceptual difference from the PCA-based procedure.

2. The other difference from the procedure in FIG. 9 is the choice of the metric, the procedure in FIG. 10 is based on Delta TCCs rather than CD sensitivities from a chosen pattern set. This difference is independent of the previous difference, so one could also consider for example using the Gram-Schmidt procedure for CD sensitivities, or using PCA for Delta TCCs. Since the metric is based on Delta TCCs in the new procedure, thus it removes the pattern dependence. Moreover, the metric can also be based on aerial images or resist images, or 1D Delta TCCs as described in U.S. patent application No. 61/113,024 (P-3314), incorporated by reference herein in its entirety. Here, a 1D Delta TCC is defined as the 1D components of a Delta TCC.

In particular, for a 2D mask image $M(k_x, k_y)$, the complete delta aerial image can be expressed as $$\Delta I(x, y) = \sum_{(kx1,ky1,kx2,ky2)} \Delta TCC(k_{x1}, k_{y1}, k_{x2}, k_{y2}) M(k_{x1}, k_{y1})$$
$$M^*(k_{x2}, k_{y2}) \exp(-j(k_{x1} - k_{x2})x - j(k_{y1} - k_{y2})y)$$

Now consider a 1D (e.g. vertical) mask. Its frequency representation $M(k_x, k_y)$ is $M_X(k_x)\delta(k_y)$, where $\delta(k_y)$ is the Dirac-Delta function. For this mask image, the delta aerial image intensity is computed as:

$$\Delta I(x, y) = \sum_{(k_{x1}, k_{x2})} \Delta TCC(k_{x1}, 0, k_{x2}, 0) M_X(k_{x1}) M_X^*(k_{x2}) \exp(-j(k_{x1} - k_{x2})x)$$

As expected, the delta aerial image intensity does not depend on y. Similarly, the system response to 1D horizontal patterns is fully encapsulated in $\Delta TCC(0, k_{y1}, 0, k_{y2})$.

The present inventors recognize that the typical 2D mask images have most energy concentrated around the x-axis and y-axis in frequency domain. This fact can also be understood as a consequence of the Manhattan nature of mask geometries. For example, one can do a SVD (Singular Value Decomposition) of the mask image, i.e., express $M(k_1, k_2)$ as a sum of products of 1D vertical and 1D horizontal images, i.e., $$M(k_x, k_y) = \sum_n M_{X,n}(k_x) M_{Y,n}(k_y).$$

Typically, the DC (zero-frequency) component for either $M_{X,i}$ or $M_{Y,i}$ would dominate all the AC (non-zero-frequency) components. So when we look at the mask image in frequency domain, they should indeed have most of the energy near the x- and y-axes. Therefore, one can often only look at the 1D components of the Delta TCCs in order to capture the most important properties.

Thus, a 1D Delta TCC is defined as the collection of the 1D components of the 2D Delta TCC. More specifically, for a 2D Delta TCC represented as $\Delta TCC(k_{x1}, k_{y1}, k_{x2}, k_{y2})$, the 1D Delta TCC is defined as $$\Delta TCC_{1D}(k_{x1}, k_{y1}, k_{x2}, k_{y2}) = \begin{cases} \Delta TCC(k_{x1}, k_{y1}, k_{x2}, k_{y2}) & k_{x1} = k_{x2} = 0 \text{ or } k_{y1} = k_{y2} = 0 \\ 0 & \text{otherwise} \end{cases}$$

Figure 11:
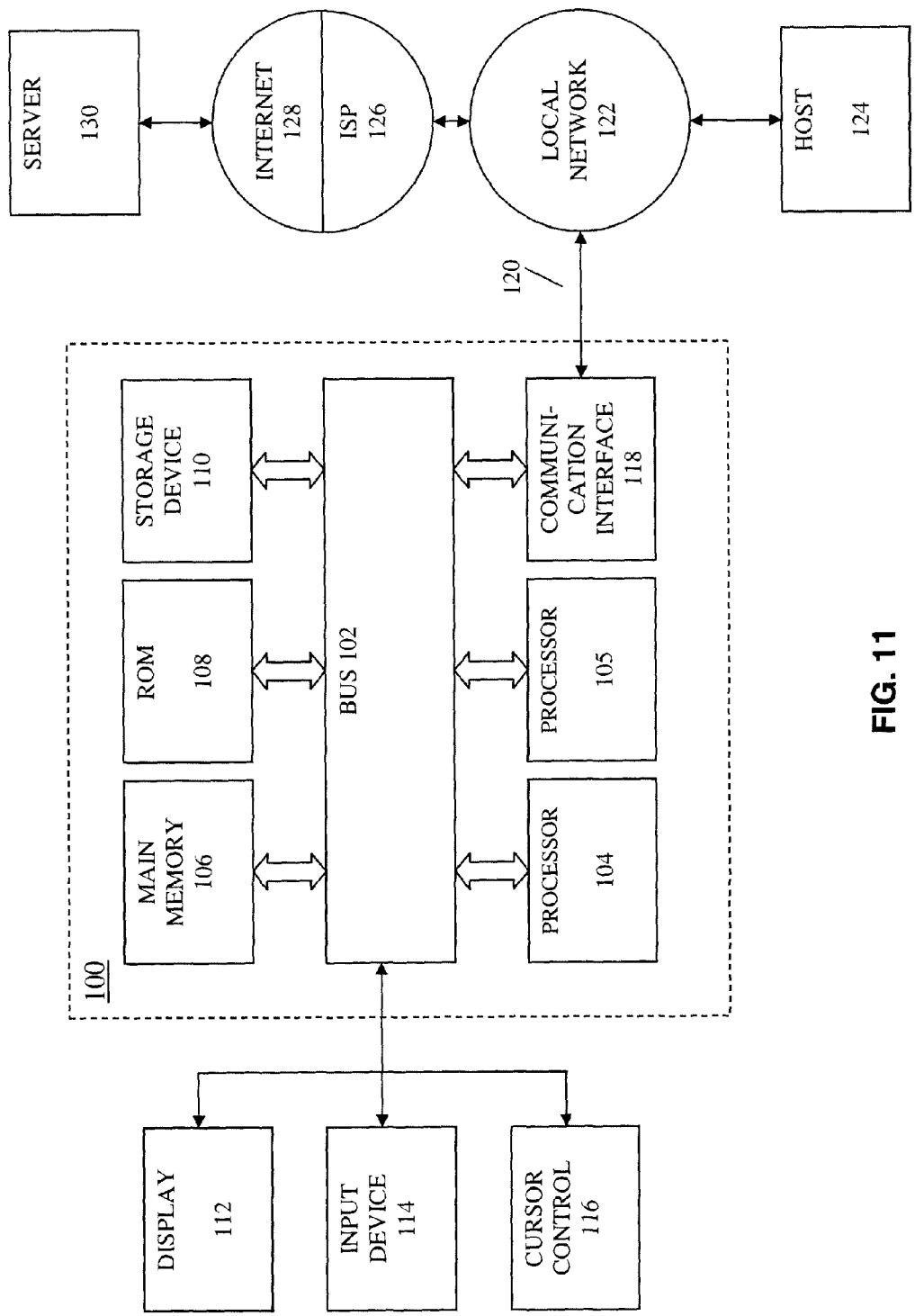
FIG. 11 is a block diagram that illustrates a computer system which can assist in the implementation of the gauge design methods of the present invention.

FIG. 11 is an exemplary block diagram that illustrates a computer system 100 which can implement certain functions of the calibration gauge design method disclosed herein.

Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, portions of the calibration gauge design process may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, and volatile media and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 12:
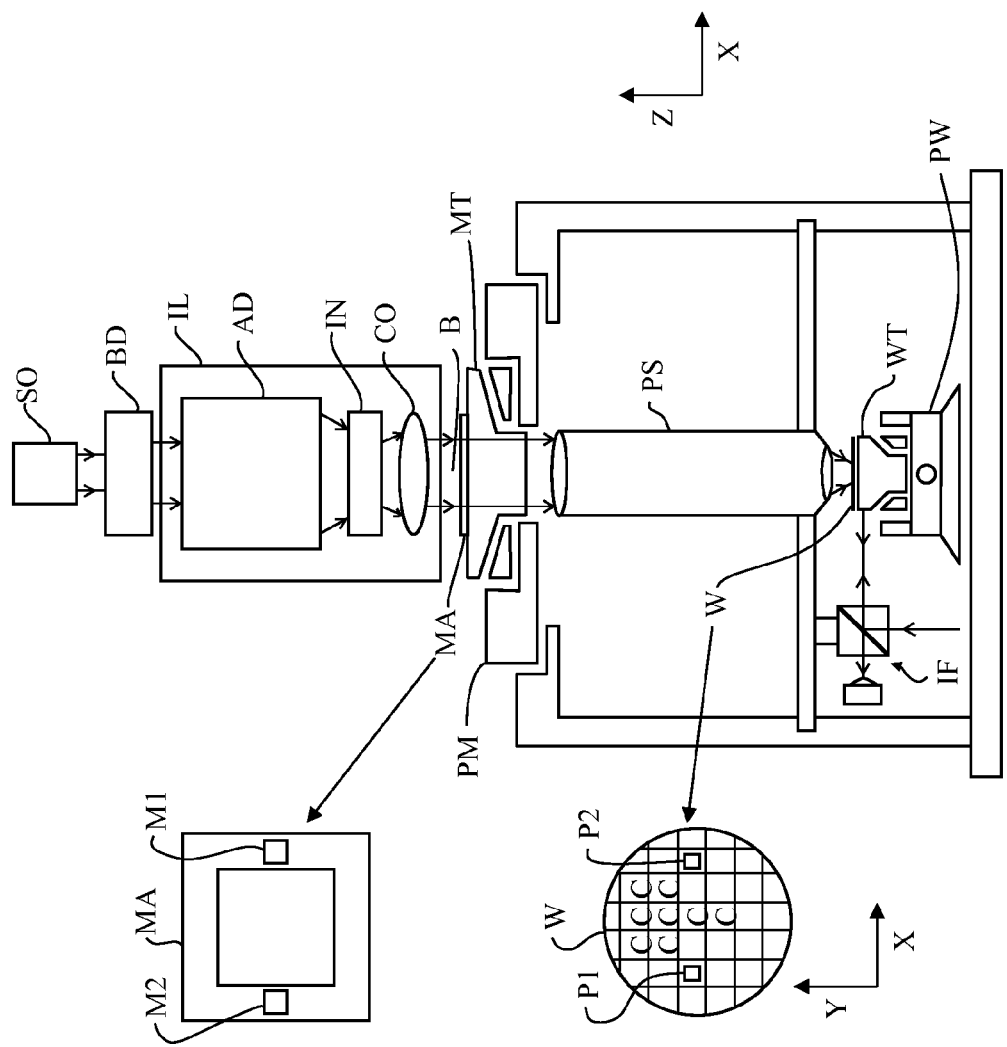
FIG. 12 schematically depicts a lithographic projection apparatus suitable for use with, or an application of, the gauge design methods of the present invention.

FIG. 12 schematically depicts an exemplary lithographic projection apparatus whose simulated performance and/or model parameters could be calibrated utilizing the process of present invention. The apparatus comprises:

a radiation system Ex, IL, for supplying a projection beam PB of radiation. In this particular case, the radiation system also comprises a radiation source LA;

a first object table (mask table) MT provided with a mask holder for holding a mask MA (e.g., a reticle), and connected to first positioning means for accurately positioning the mask with respect to item PL;

a second object table (substrate table) WT provided with a substrate holder for holding a substrate W (e.g., a resist-coated silicon wafer), and connected to second positioning means for accurately positioning the substrate with respect to item PL;

a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as a-outer and a-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 12 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses at least both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g. so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 12. However, in the case of a wafer stepper (as opposed to a step-and-scan tool) the mask table MT may just be connected to a short stroke actuator, or may be fixed.

The depicted tool can be used in two different modes:

In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;

In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

The concepts disclosed herein may simulate or mathematically model any generic imaging system for imaging sub wavelength features, and may be especially useful with emerging imaging technologies capable of producing wavelengths of an increasingly smaller size. Emerging technologies already in use include EUV (extreme ultra violet) lithography that is capable of producing a 193 nm wavelength with the use of a ArF laser, and even a 157 nm wavelength with the use of a Fluorine laser. Moreover, EUV lithography is capable of producing wavelengths within a range of 20-5 nm by using a synchrotron or by hitting a material (either solid or a plasma) with high energy electrons in order to produce photons within this range. Because most materials are absorptive within this range, illumination may be produced by reflective mirrors with a multi-stack of Molybdenum and Silicon. The multi-stack mirror has a 40 layer pairs of Molybdenum and Silicon where the thickness of each layer is a quarter wavelength. Even smaller wavelengths may be produced with X-ray lithography. Typically, a synchrotron is used to produce an X-ray wavelength. Since most material is absorptive at x-ray wavelengths, a thin piece of absorbing material defines where features would print (positive resist) or not print (negative resist).

While the concepts disclosed herein may be used for imaging on a substrate such as a silicon wafer, it shall be understood that the disclosed concepts may be used with any type of lithographic imaging systems, e.g., those used for imaging on substrates other than silicon wafers.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A computer-implemented method for designing test gauges for calibrating a simulation model of an optical lithographic process, the method comprising:
    identifying a first parameter of the simulation model;
    computing one or more of a width and a spacing of features in a pattern that optimizes a metric associated with the parameter; and
    designing one or more test gauges that include the pattern, wherein the identified parameter is chosen as an axis in building a model parametric space within a sensitivity space from which a target number of test gauges are selected;
    wherein the identifying and computing steps are performed using a computer.

2. A method according to claim 1, further comprising:
    computing one or more assisting features for arrangement in the pattern that further optimizes the metric.

3. A method according to claim 2, wherein the step of computing the one or more assisting features includes computing a guidance map for placement of the assisting features in the pattern.

4. A method according to claim 2, wherein the step of computing the one or more assisting features includes applying manufacturability constraints to a size and spacing of the assisting features.

5. A method according to claim 1, wherein the metric is a sensitivity to a critical dimension in an aerial image resulting from the computed pattern.

6. A method according to claim 5, wherein the computing step includes:
    determining a perturbed value of the identified parameter;
    using the perturbed value to compute a delta operator; and
    using the delta operator to compute the aerial image.

7. A method according to claim 6, wherein the delta operator comprises transmission cross coefficients.

8. The method of claim 1, wherein the method further comprises:
    repeating the steps of identifying, computing and designing for different parameters of the simulation model to build different respective model parametric spaces within the same sensitivity space from which the target number of test gauges is selected.

9. The method of claim 8, wherein while building the different respective model parametric spaces within the sensitivity space, only one parameter is varied while additional different parameters of the simulation model are kept constant.

10. The method of claim 8, wherein for N identified parameters of the simulation model, the target number of test gauges is $N*(N-1)$.

11. A computer-implemented method for designing test gauges for calibrating a simulation model of an optical lithographic process, the method comprising:
    identifying at least two different parameters of the simulation model; and
    designing test gauges for calibrating the parameters of the simulation model, including at least one first test gauge that maximizes sensitivity to a first change with respect to the parameters, and at least one second test gauge that maximizes sensitivity to a second change with respect to the parameters, wherein the second change exhibits substantial orthogonality to the first change, wherein for a target number of test gauges, an enclosed volume in a sensitivity space is maximized;
    wherein the identifying and computing steps are performed using a computer.

12. A method according to claim 11, wherein the designing step includes:
    designing a pair of test gauges that maximize a pair-wise sensitivity between a first and a second one of the parameters.

13. A method according to claim 11, wherein the designing step includes:
    building a model parametric space in the sensitivity space based on the identified parameters;
    identifying a direction in the model parametric space; and
    designing one or more test gauges that maximize a sensitivity to changes in parameters associated with the identified direction.

14. A method according to claim 13, wherein the designing step further includes:
    identifying a direction associated with an actual sensitivity of the designed test gauges;
    removing that direction from the model parametric space; and
    iteratively identifying a new direction, designing test gauges that maximize sensitivity in the new direction, identifying the direction associated with the actual sensitivities, and removing that direction from the model parametric space.

15. A method according to claim 13, wherein the step of building the model parametric space includes:
- identifying a pattern set; and
- calculating sensitivities of the identified model parameters to the patterns in the pattern set.

16. A method according to claim 13, wherein the step of building the model parametric space includes:
- calculating a set of perturbations associated with respective ones of the identified model parameters; and
- decomposing the set of perturbations to form a hyperspace.

17. A method according to claim 16, wherein the perturbations are characterized by differences in transmission cross coefficients (TCCs) from a nominal simulation model.

18. A method according to claim 17, wherein the step of designing one or more test gauges includes determining a most sensitive line width/pitch combination of patterns comprising the test gauges.

19. A method according to claim 18, wherein the step of designing one or more test gauges further includes determining an optimal assist feature placement relative to the patterns.

20. A method according to claim 11, wherein sensitivity is characterized in connection with predicted and actual critical dimensions of features printed using the lithographic process.

21. A computer program product comprising a non-transitory computer readable medium having recorded therein a set of instructions, which when executed by a computer, perform a method for designing test gauges for calibrating a simulation model of an optical lithographic process, the method comprising:
- identifying at least two different parameters of the simulation model;
- designing test gauges for calibrating the parameters of the simulation model, including at least one first test gauge that maximizes sensitivity to a first change with respect to the parameters, and at least one second test gauge that maximizes sensitivity to a second change with respect to the parameters, wherein the second change exhibits substantial orthogonality to the first change, wherein for a target number of test gauges, an enclosed volume in a sensitivity space is maximized.

22. A computer program product according to claim 21, wherein the designing step includes:
- designing a pair of test gauges that maximize a pair-wise sensitivity between a first and a second one of the parameters.

23. A computer program product according to claim 21, wherein the designing step includes:
- building a model parametric space within the sensitivity space based on the identified parameters;
- identifying a direction in the model parametric space; and
- designing one or more test gauges that maximize a sensitivity to changes in parameters associated with the identified direction.

24. A computer program product according to claim 23, wherein the designing step further includes:
- identifying a direction associated with an actual sensitivity of the designed test gauges;
- removing that direction from the model parametric space; and
- iteratively identifying a new direction, designing test gauges that maximize sensitivity in the new direction, identifying the direction associated with the actual sensitivities, and removing that direction from the model parametric space.

25. A computer program product according to claim 23, wherein the step of building the model parametric space includes:
- identifying a pattern set; and
- calculating sensitivities of the identified model parameters to the patterns in the pattern set.

26. A computer program product according to claim 23, wherein the step of building the model parametric space includes:
- calculating a set of perturbations associated with respective ones of the identified model parameters; and
- decomposing the set of perturbations to form a hyperspace.

27. A computer program product according to claim 26, wherein the perturbations are characterized by differences in transmission cross coefficients (TCCs) from a nominal simulation model.

* * * * *